(12) United States Patent
Park et al.

(10) Patent No.: US 12,262,606 B2
(45) Date of Patent: Mar. 25, 2025

(54) DISPLAY DEVICE INCLUDING CONDUCTIVE MEMBER ELECTRICALLY CONNECTED TO POWER LINE

(71) Applicant: Samsung Display Co., LTD., Yongin-si (KR)

(72) Inventors: Jun-Hyun Park, Suwon-si (KR); Dong-Woo Kim, Yongin-si (KR); An-Su Lee, Seoul (KR); Kang-Moon Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 425 days.

(21) Appl. No.: 17/623,239

(22) PCT Filed: Nov. 29, 2019

(86) PCT No.: PCT/KR2019/016721
§ 371 (c)(1),
(2) Date: Dec. 27, 2021

(87) PCT Pub. No.: WO2021/025236
PCT Pub. Date: Feb. 11, 2021

(65) Prior Publication Data
US 2022/0415992 A1 Dec. 29, 2022

(30) Foreign Application Priority Data
Aug. 6, 2019 (KR) .................. 10-2019-0095312

(51) Int. Cl.
*H10K 59/131* (2023.01)
(52) U.S. Cl.
CPC .................. *H10K 59/131* (2023.02)

(58) Field of Classification Search
CPC ............... G02F 1/1345; G02F 1/13458; G02F 1/136286; G02F 1/1362; G02F 1/134336;
(Continued)

(56) References Cited

U.S. PATENT DOCUMENTS 7,309,955 B2   12/2007   Kim
7,956,945 B2    6/2011   Kim
(Continued)

FOREIGN PATENT DOCUMENTS

CN   101604103   12/2009
CN   103003861    3/2013
(Continued)

OTHER PUBLICATIONS

Chinese Office Action with English translation for Chinese Patent Application No. 201980099088.8, dated May 25, 2024.
(Continued)

*Primary Examiner* — Vu A Vu
*Assistant Examiner* — Jeremy Daniel Watts
(74) *Attorney, Agent, or Firm* — KILE PARK REED & HOUTTEMAN PLLC

(57) ABSTRACT

A display device including a substrate, a first upper power line, a conductive member, a protective insulating layer, an upper connection member, and a sub-pixel structure. The upper connection member is disposed in a first pad area and a first peripheral area on a planarization layer, and electrically connects the first upper power line and the conductive member through a first contact hole, which is formed in the protective insulating layer and the planarization layer located on the conductive member, and a second contact hole, which is formed in the protective insulating layer and the planarization layer located on the first upper power line.

20 Claims, 26 Drawing Sheets

(58) Field of Classification Search
CPC .............. H10K 50/88; H10K 50/805; H10K 59/131–1315; H01L 27/1214–1296; H01L 27/124–1244
See application file for complete search history.

(56) References Cited

U.S. PATENT DOCUMENTS

| | | | |
|---|---|---|---|
| 10,236,330 B2 | 3/2019 | Maruyama | |
| 10,312,309 B2 | 6/2019 | Lin et al. | |
| 10,686,025 B2 | 6/2020 | Oh | |
| 10,901,542 B2 | 1/2021 | Kim et al. | |
| 10,930,723 B2 | 2/2021 | Shim et al. | |
| 2006/0145606 A1* | 7/2006 | Lee | H10K 59/131 313/509 |
| 2012/0146085 A1 | 6/2012 | Park et al. | |
| 2013/0020574 A1 | 1/2013 | Sato | |
| 2013/0027648 A1 | 1/2013 | Moriwaki | |
| 2016/0099299 A1 | 4/2016 | Chung et al. | |
| 2017/0184935 A1* | 6/2017 | Park | G02F 1/133345 |
| 2017/0287986 A1 | 10/2017 | Jeong et al. | |
| 2017/0345882 A1 | 11/2017 | Nam et al. | |
| 2017/0346034 A1* | 11/2017 | Hatakeyama | H10K 50/841 |
| 2018/0113545 A1 | 4/2018 | Shim et al. | |
| 2018/0151820 A1* | 5/2018 | Saiki | H05K 1/0263 |
| 2018/0182274 A1 | 6/2018 | Jung et al. | |
| 2018/0188616 A1* | 7/2018 | Jeong | G02F 1/134336 |
| 2018/0330653 A1* | 11/2018 | Zhou | H01L 27/124 |
| 2019/0103421 A1* | 4/2019 | Kikuchi | H01L 27/1248 |
| 2019/0206906 A1* | 7/2019 | Zeng | H01L 27/1222 |
| 2020/0090567 A1* | 3/2020 | Lee | G09G 3/3266 |
| 2020/0284965 A1* | 9/2020 | Peng | G02F 1/134336 |
| 2020/0395562 A1* | 12/2020 | Minami | G09G 3/3283 |

FOREIGN PATENT DOCUMENTS

| | | |
|---|---|---|
| CN | 109244105 | 1/2019 |
| JP | 5359162 | 12/2013 |
| JP | 2017-173505 | 9/2017 |
| KR | 10-0603836 | 7/2006 |
| KR | 10-2007-0072140 | 7/2007 |
| KR | 10-2016-0015060 | 2/2016 |
| KR | 10-2016-0039704 | 4/2016 |
| KR | 10-2017-0051680 | 5/2017 |
| KR | 10-2018-0044491 | 5/2018 |
| KR | 10-2018-0049005 | 5/2018 |
| KR | 10-2018-0076417 | 7/2018 |
| KR | 10-2019-0053585 | 5/2019 |
| KR | 10-2019-0066748 | 6/2019 |

OTHER PUBLICATIONS

Korean Office Action with English translation for Korean Patent Application No. 10-2019-0095312, dated Feb. 11, 2025.

* cited by examiner

DISPLAY DEVICE INCLUDING CONDUCTIVE MEMBER ELECTRICALLY CONNECTED TO POWER LINE

CROSS REFERENCE TO RELATED APPLICATION

This application is a National Stage Entry of International Application No. PCT/KR2019/016721, filed on Nov. 29, 2019, and claims priority from and the benefit of Korean Patent Application No. 10-2019-0095312, filed on Aug. 6, 2019, each of which is hereby incorporated by reference for all purposes as if fully set forth herein.

BACKGROUND

Field

Embodiments of the invention relate generally to a display device. More particularly, embodiments of the present inventive concept relate to a display device including a power line.

Discussion of the Background

Flat panel display devices are used as display devices for replacing a cathode ray tube display device due to lightweight and thin characteristics thereof. As representative examples of such flat panel display devices, there are a liquid crystal display device and an organic light emitting diode display device.

Recently, a display device having an enlarged size and a high resolution has been developed. The display device may include a display area, a peripheral area, and first and second pad areas. In this case, pixels may be disposed in the display area, and an image may be displayed through the pixels. In addition, signal lines and power lines electrically connected to the pixels may be disposed in the peripheral area surrounding the display area. Moreover, first pad electrodes may be disposed in the first pad area located in one side of the peripheral area. Second pad electrodes may be disposed in the second pad area located in an opposite side of the peripheral area. An external device may generate signals, a power, and the like, and may provide the signals and the power to the pixel through the first and second pad electrodes and the lines. When the display device is driven with a high luminance, a current may be concentrated in a power line disposed in the peripheral area, so that a temperature may be increased. In this case, a heat generation phenomenon may cause a short of the power line or deformation of an insulating layer located around the power line. In addition, as a size of the display area increases, a voltage drop phenomenon may occur. In other words, a defect of the display device may be caused by the heat generation phenomenon of the power line occurring in the peripheral area and the voltage drop phenomenon occurring in the display area.

The above information disclosed in this Background section is only for understanding of the background of the inventive concepts, and, therefore, it may contain information that does not constitute prior art.

SUMMARY

An embodiment of the present invention provides a display device including a power line.

Additional features of the inventive concepts will be set forth in the description which follows, and in part will be apparent from the description, or may be learned by practice of the inventive concepts.

An embodiment of the present invention provides a display device including a substrate, a first upper power line, a conductive member, a protective insulating layer, an upper connection member, and a sub-pixel structure. The substrate includes a display area, a peripheral area surrounding the display area and including a first peripheral area and a second peripheral area, a first pad area located in one side of the peripheral area, and a second pad area located in an opposite side of the peripheral area. The first upper power line is disposed in the first pad area on the substrate. The conductive member is disposed in the first peripheral area that is adjacent to the first pad area on the substrate. The protective insulating layer is disposed on the conductive member. The planarization layer is disposed on the protective insulating layer. The upper connection member is disposed in the first pad area and the first peripheral area on the planarization layer, and electrically connect the first upper power line and the conductive member through a first contact hole, which is formed in the protective insulating layer and the planarization layer located on the conductive member, and a second contact hole, which is formed in the protective insulating layer and the planarization layer located on the first upper power line. The sub-pixel structure is disposed in the display area on the protective insulating layer.

The display device may further include a first connection pattern and a second connection pattern. The first connection pattern may be disposed between the protective insulating layer and the planarization layer to overlap the first contact hole, and may cover a top surface of the conductive member so that the conductive member is not exposed. The second connection pattern may be disposed between the protective insulating layer and the planarization layer to overlap the second contact hole, and may cover a top surface of the first upper power line so that the first upper power line is not exposed.

The conductive member may include a first extension part and a second extension part. The first extension part may extend in a first direction that is parallel to a top surface of the substrate, and may be located in the first peripheral area. The second extension part may extend from one side of the first extension part in a second direction, which is a direction from the first peripheral area to the display area, and may be located in a portion of the first peripheral area and the display area.

The first contact hole may be located to correspond to the first extension part, and may have a bar shape when viewed in a plan view.

A length of the first contact hole in the first direction may be equal to a length of the first extension part in the first direction.

The sub-pixel structure may include a lower electrode disposed in the display area on the planarization layer, a light emitting layer disposed on the lower electrode, and an upper electrode disposed on the light emitting layer.

The upper electrode may be electrically connected to the second extension part through a third contact hole, which is formed in the protective insulating layer and the planarization layer located on the second extension part, and the second extension part may be defined as a first sub-power line.

The display device may further include a third connection pattern and a first electrode pattern. The third connection pattern may be disposed between the protective insulating layer and the planarization layer to overlap the third contact hole, and may cover a top surface of the second extension part so that the second extension part is not exposed. The first electrode pattern may be disposed between the upper electrode and the third connection pattern.

The display device may further include a first lower power line disposed in the second pad area on the substrate, a second lower power line disposed in the second pad area and the second peripheral area that is adjacent to the second pad area on the substrate, and fan-out lines disposed between the substrate and the first and second lower power lines in the second pad area and the second peripheral area.

A first power may be provided to the first lower power line. A second power having a voltage level that is different from a voltage level of the first power may be provided to the second lower power line. A data signal may be provided to the fan-out lines.

The display device may further include a lower connection member disposed in the second pad area and the second peripheral area on the planarization layer. The lower connection member may electrically connect the first lower power line and the first sub-power line through a fourth contact hole, which is formed in the protective insulating layer and the planarization layer located on the first lower power line, and a fifth contact hole, which is formed on the first sub-power line that is adjacent to the second peripheral area.

The display device may further include a fourth connection pattern and a fifth connection pattern. The fourth connection pattern may be disposed between the protective insulating layer and the planarization layer to overlap the fourth contact hole, and may cover the fourth contact hole so that the first lower power line is not exposed. The fifth connection pattern may be disposed between the protective insulating layer and the planarization layer to overlap the fifth contact hole, and may cover the fifth contact hole so that the first sub-power line is not exposed.

The light emitting layer may not be disposed in a portion in which the third contact hole is formed.

The display device may further include upper inspection pads located on a same layer as the first upper power line and the conductive member. The upper inspection pads may be arranged in a first direction that is parallel to a top surface of the substrate in the first peripheral area.

The display device may further include a second upper power line disposed in the first pad area and the first peripheral area on the substrate. The second upper power line may be located at a lower level than the first upper power line and the conductive member. A first power may be provided to the first upper power line, and a second power having a voltage level that is different from a voltage level of the first power may be provided to the second upper power line.

The second upper power line may include a first line extension part, a second line extension part, and a third line extension part. The first line extension part may be located in the first peripheral area, and may extend in a first direction that is parallel to a top surface of the substrate. The second line extension part may extend from one side of the first line extension part in a third direction, which is a direction from the first peripheral area to the first pad area, so as to be located in the first pad area. The third line extension part may extend from an opposite side of the first line extension part in a second direction, which is a direction from the first peripheral area to the display area, so as to be located in the display area, and may intersect the conductive member.

The display device may further include a second sub-power line disposed in a portion of the first peripheral area and the display area. The second sub-power line may extend in the second direction, and may be electrically connected to the third line extension part in the first peripheral area.

The second sub-power line may be located on a same layer as the first upper power line and the conductive member.

The display device may further include first pad electrodes disposed in the first pad area on the substrate and second pad electrodes disposed in the second pad area on the substrate.

The display device may further include first power circuit boards to which a first power is applied, second power circuit boards to which a second power having a voltage level that is different from a voltage level of the first power is applied, and driving circuit boards to which a data signal is applied. The first power circuit board and the second power circuit board may be electrically connected to the first pad electrodes, and the first power circuit board, the second power circuit board, and the driving circuit board may be electrically connected to the second pad electrodes.

Since the display device according embodiments of the present invention includes the conductive member, and the first contact hole formed on the conductive member has a relatively wide area, the heat generation phenomenon that may occur in the first peripheral area may be reduced. In addition, since the display device includes the third contact hole, and the upper electrode receives the first power from the first sub-power line in each of the sub-pixel areas, the voltage drop phenomenon that may occur in the display area may be reduced. Accordingly, according to the display device, both the heat generation phenomenon that may occur in the first peripheral area and the voltage drop phenomenon that may occur in the display area may be reduced.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
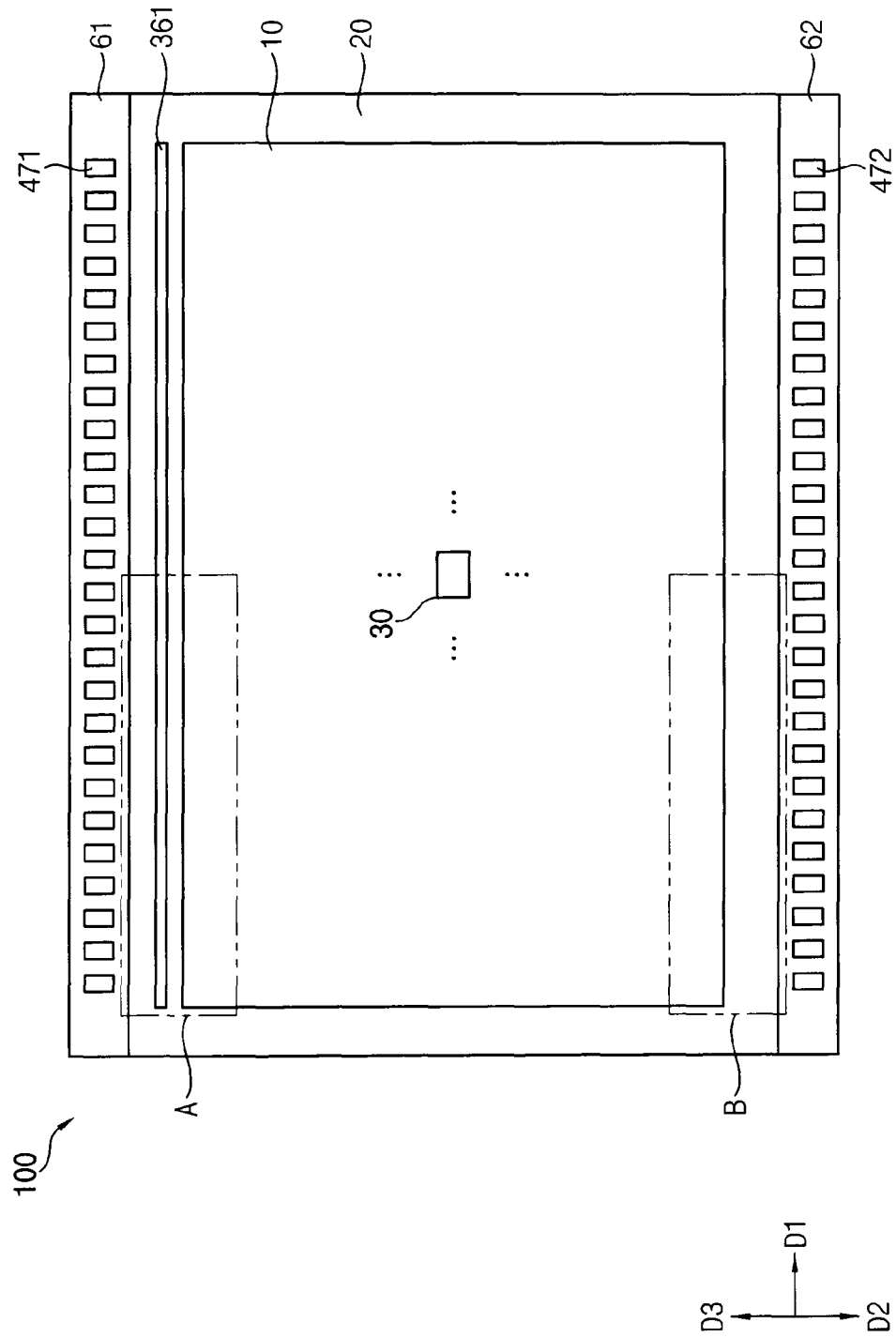
FIG. 1 is a plan view showing a display device according to embodiments of the present invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
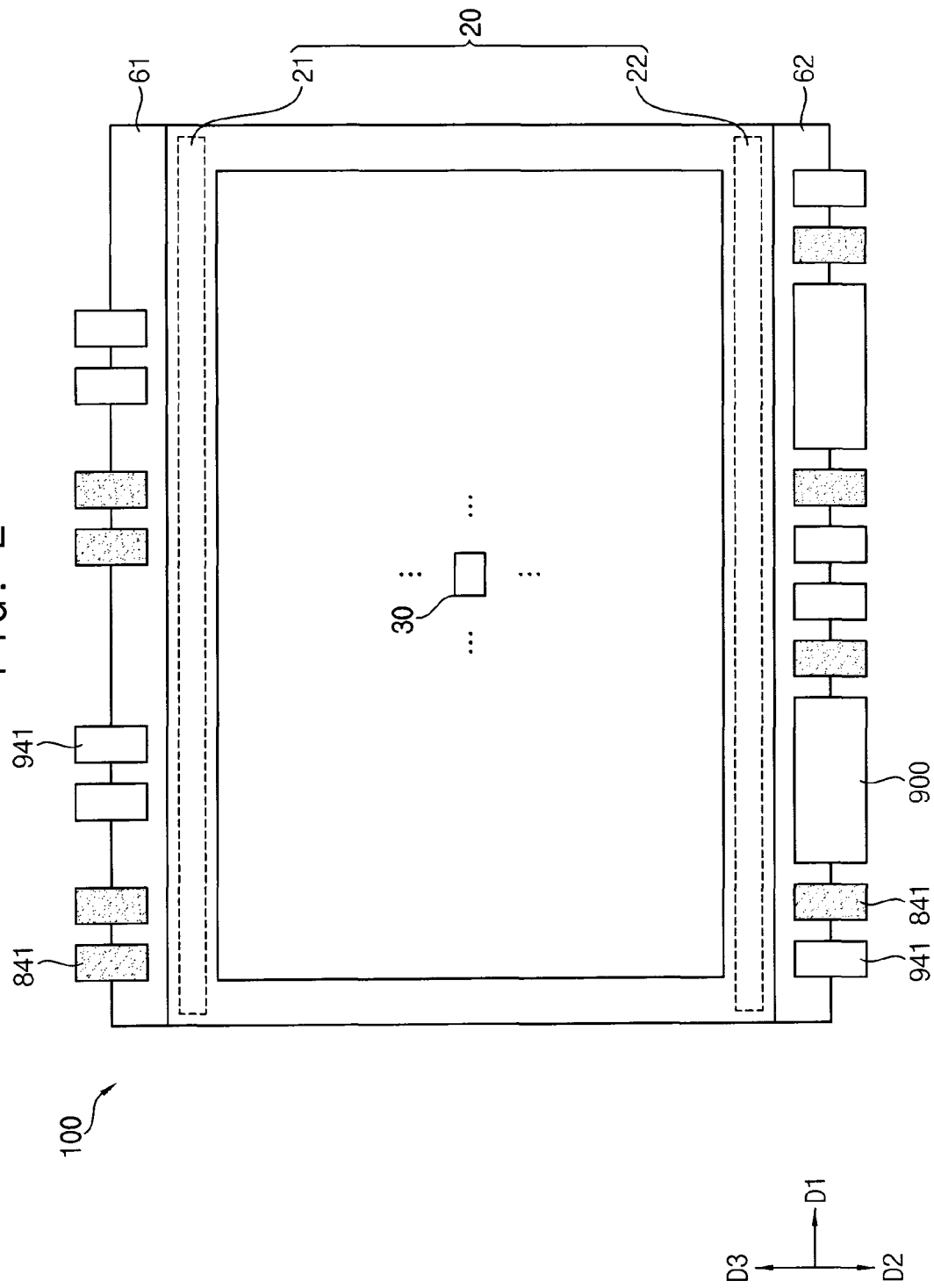
FIG. 2 is a plan view for describing circuit boards included in the display device of FIG. 1.

FIG. 1 is a plan view showing a display device according to embodiments of the present invention; FIG. 2 is a plan view for describing circuit boards included in the display device of FIG. 1; and FIG. 3 is a block diagram for describing an external device electrically connected to the display device of FIG. 1.

Figure 3:
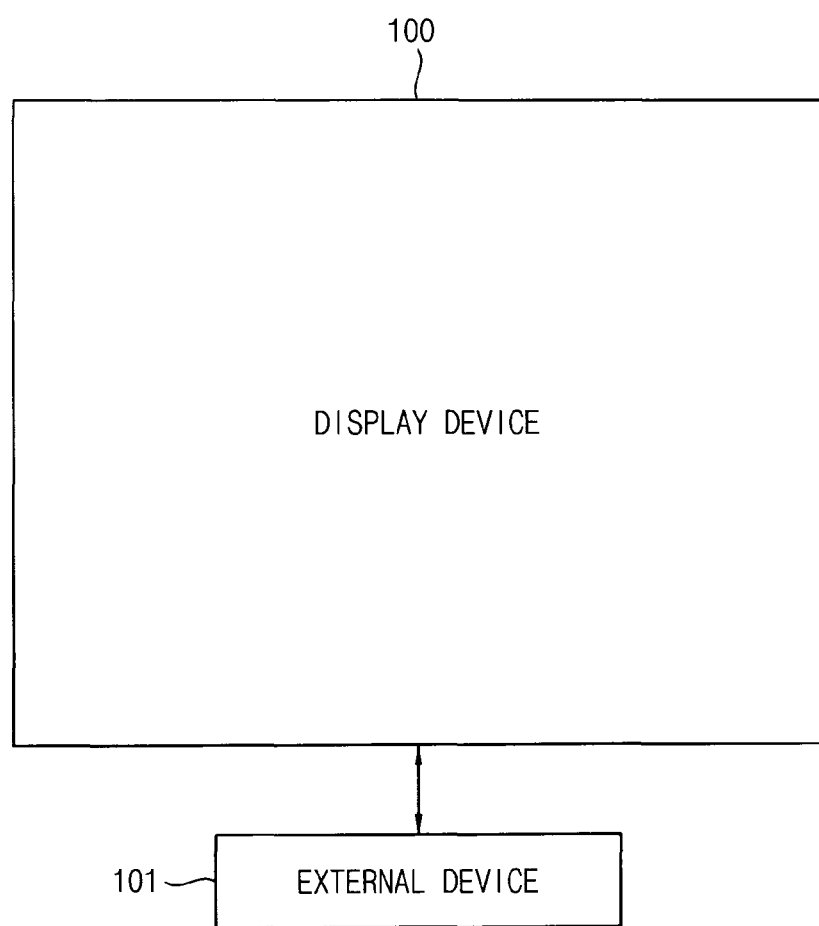
FIG. 3 is a block diagram for describing an external device electrically connected to the display device of FIG. 1.

Referring to FIGS. 1, 2, and 3, a display device 100 may include first pad electrodes 471, second pad electrodes 472, first power circuit boards 841, second power circuit boards 941, driving circuit boards 900, and the like.

The display device 100 may include: a display area 10; a peripheral area 20 substantially surrounding the display area 10; a first pad area 61 located in one side of the peripheral area 20; and a second pad area 62 located in an opposite side of the peripheral area 20. In this case, the peripheral area 20 may include a first peripheral area 21 and a second peripheral area 22. For example, when viewed in a plan view of the display device 100, the first pad area 61 may be located on an upper portion of the display area 10, and the first peripheral area 21 may be interposed between the display area 10 and the first pad area 61. In addition, the second pad area 62 may be located on a lower portion of the display area 10, and the second peripheral area 22 may be interposed between the display area 10 and the second pad area 62.

A plurality of sub-pixel areas 30 may be arranged over the whole display area 10 in a first direction D1, which is parallel to a top surface of the display device 100, and a second direction D2 that is orthogonal to the first direction D1. A sub-pixel SP of FIG. 4 may be disposed in each of the sub-pixel areas 30, and the sub-pixel SP may include transistors, organic light emitting diodes, and the like. An image may be displayed in the display area 10 through the sub-pixel SP.

For example, sub-pixels SP may include first, second, and third sub-pixels. The first sub-pixel may include a first organic light emitting diode for emitting a red light, the second sub-pixel may include a second organic light emitting diode for emitting a green light, and the third sub-pixel may include a third organic light emitting diode for emitting a blue light.

The first organic light emitting diode may overlap transistors included in the first sub-pixel, the second organic light emitting diode may overlap transistors included in the second sub-pixel, and the third organic light emitting diode may overlap transistors included in the third sub-pixel. In some embodiments, the first organic light emitting diode may overlap a portion of the transistors included in the first sub-pixel and a portion of transistors included in a sub-pixel that is different from the first sub-pixel, the second organic light emitting diode may overlap a portion of the transistors included in the second sub-pixel and a portion of transistors included in a sub-pixel that is different from the second sub-pixel, and the third organic light emitting diode may overlap a portion of the transistors included in the third sub-pixel and a portion of transistors included in a sub-pixel that is different from the third sub-pixel. For example, the first to third organic light emitting diodes may be arranged by using an RGB stripe scheme in which rectangles having the same size are sequentially arranged, an S-stripe scheme including a blue organic light emitting diode having a relatively large area, a WRGB scheme further including a white organic light emitting diode, a PenTile™ scheme in which RG-GB patterns are repeatedly arranged, or the like.

In addition, the sub-pixel SP may include at least one driving transistor, at least one switching transistor, at least one capacitor, and the like. In the embodiments, the sub-pixel SP may include one driving transistor (e.g., a first transistor TR1 of FIG. 4), six switching transistors (e.g., second to seventh transistors TR2, TR3, TR4, TR5, TR6, and TR7 of FIG. 4), one storage capacitor (e.g., a storage capacitor CST of FIG. 4), and the like.

However, although the display device 100 according to the present invention has been described as having a rectangular shape when viewed in a plan view, the shape of the display device 100 is not limited thereto. For example, the display device 100 may have a triangular shape, a rhombic shape, a polygonal shape, a circular shape, an elliptical shape, or a track shape when viewed in a plan view.

A plurality of lines may be disposed in the peripheral area 20. For example, the lines may include a data signal line, a gate signal line, an emission control signal line, a gate initialization signal line, an initialization voltage line, a first power line, a second power line, and the like. The lines may extend from the peripheral area 20 to the display area 10 so as to be electrically connected to the sub-pixels SP. Moreover, a gate driver, a data driver, and the like may be disposed in the peripheral area 20.

In the embodiments, a conductive member (e.g., a first extension part of a conductive member 360 of FIG. 5) may be disposed in the first peripheral area 21, and as shown in FIG. 1, a first contact hole 361 formed in a protective insulating layer and a planarization layer, which will be described below, may be located on the conductive member. In other words, the first contact hole 361 may be located to correspond to the conductive member, and may have a bar shape when viewed in a plan view. In addition, a length of the first contact hole 361 in the first direction D1 may be substantially equal to a length of the conductive member in the first direction D1. In other words, a portion of a top surface of the conductive member may be exposed through the first contact hole 361.

Referring again to FIGS. 1 to 3, the first pad electrodes 471 may be disposed in the first pad area 61, and the second pad electrodes 472 may be disposed in the second pad area 62. Only the first power circuit board 841 and the second power circuit board 941 may be electrically connected to the first pad electrodes 471, and the first power circuit board 841, the second power circuit board 941, and the driving circuit board 900 may be electrically connected to the second pad electrodes 472. In other words, the driving circuit board 900 may not be disposed in the first pad area 61, and the first pad electrodes 471 and the driving circuit board 900 may not make direct contact with each other. For example, the first power circuit boards 841 and the second power circuit boards 941 may be alternately arranged in the first pad area 61, and the second power circuit board 941, the first power circuit board 841, and the driving circuit board 900 may be alternately arranged in the second pad area 62.

An external device 101 may be electrically connected to the display device 100 through the first power circuit board 841, the second power circuit board 941, and the driving circuit board 900. For example, one side of each of the first power circuit board 841, the second power circuit board 941, and the driving circuit board 900 may make direct contact with the first and second pad electrodes 471 and 472, and an opposite side of each of the first power circuit board 841, the second power circuit board 941, and the driving circuit board 900 may make direct contact with the external device 101.

In addition, the external device 101 may generate a data signal, a gate signal, an emission control signal, a gate initialization signal, an initialization voltage, a first power, a second power, and the like. In the embodiments, the data signal, the gate signal, the emission control signal, the gate initialization signal, and the initialization voltage generated from the external device 101 may be provided to the display device 100 through the driving circuit board 900. The first power generated from the external device 101 may be provided to the display device 100 through the first power circuit board 841, and the second power generated from the external device 101 may be provided to the display device 100 through the second power circuit board 941. For example, a voltage level of the first power (e.g., a low power voltage ELVSS of FIG. 4) may be lower than a voltage level of the second power (e.g., a high power voltage ELVDD of FIG. 4).

A driving integrated circuit may be mounted on each of the first power circuit board 841, the second power circuit board 941, and the driving circuit board 900. In other embodiments, the driving integrated circuit may be mounted on the display device 100 while being adjacent to the first and second pad electrodes 471 and 472, or each of the first power circuit board 841, the second power circuit board 941, and the driving circuit board 900 may not include the driving integrated circuit.

Figure 4:
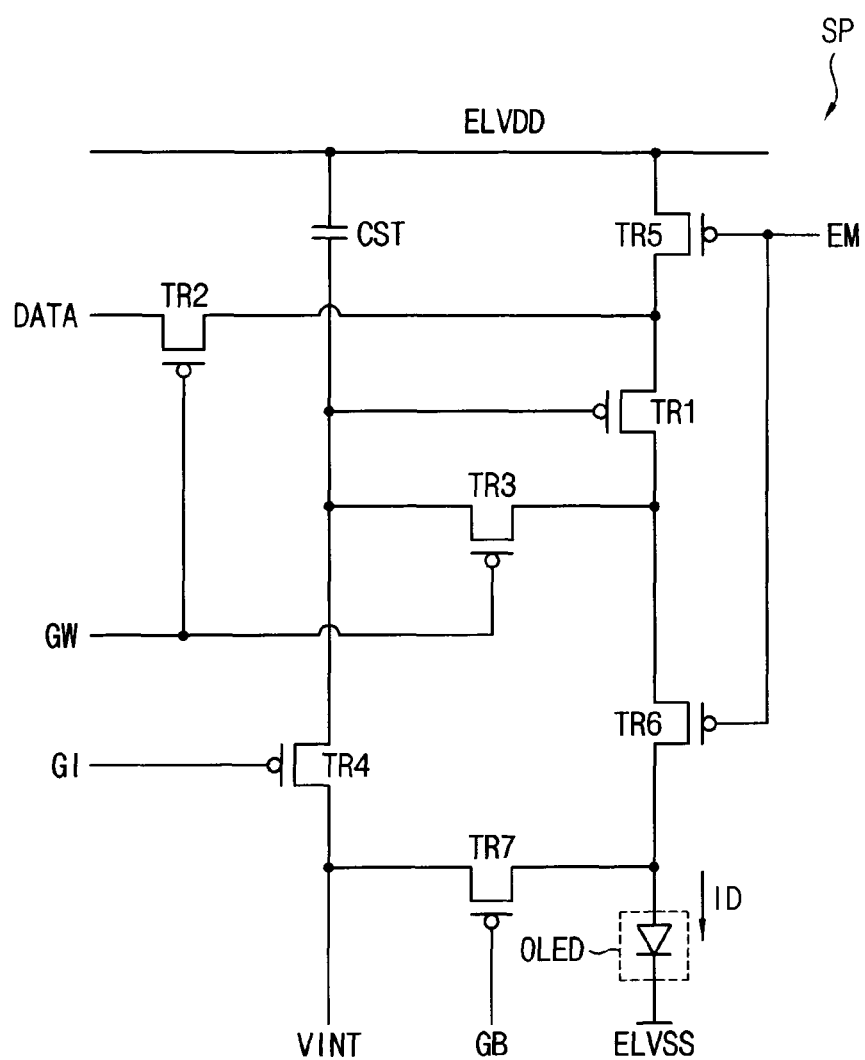
FIG. 4 is a circuit diagram showing a sub-pixel disposed in a sub-pixel area of FIG. 1.

FIG. 4 is a circuit diagram showing a sub-pixel disposed in a sub-pixel area of FIG. 1.

Referring to FIG. 4, the display device 100 may include sub-pixels SP disposed in the sub-pixel areas 30, respectively, and the sub-pixel SP may include an organic light emitting diode OLED (e.g., a sub-pixel structure 200 of FIG. 6), first to seventh transistors TR1, TR2, TR3, TR4, TR5, TR6, and TR7 (e.g., a semiconductor element 250 of FIG. 6), a storage capacitor CST, a high power voltage (ELVDD) line (e.g., a second upper power line 740 of FIG. 5 and a second lower power line 950 of FIG. 9), a low power voltage (ELVSS) line (e.g., a first upper power line 640 of FIG. 5 and a first lower power line 840 of FIG. 9), an initialization voltage (VINT) line, a data signal (DATA) line, a gate signal (GW) line, a gate initialization signal (GI) line, an emission control signal (EM) line, a diode initialization signal (GB) line, and the like. As described above, the first transistor TR1 may correspond to a driving transistor, and the second to seventh transistors TR2, TR3, TR4, TR5, TR6, and TR7 may correspond to switching transistors. Each of the first to seventh transistors TR1, TR2, TR3, TR4, TR5, TR6, and TR7 may include a first terminal, a second terminal, a channel, and a gate terminal. In the embodiments, the first terminal may be a source terminal, and the second terminal may be a drain terminal. In some embodiments, the first terminal may be a drain terminal, and the second terminal may be a source terminal.

The organic light emitting diode OLED may output a light based on a driving current ID. The organic light emitting diode OLED may include a first terminal and a second terminal. In the embodiments, the second terminal of the organic light emitting diode OLED may receive a low power voltage ELVSS (e.g., the first power), and the first terminal of the organic light emitting diode OLED may receive a high power voltage ELVDD (e.g., the second power). For example, the first terminal of the organic light emitting diode OLED may be an anode terminal, and the second terminal of the organic light emitting diode OLED may be a cathode terminal. In some embodiments, the first terminal of the organic light emitting diode OLED may be a cathode terminal, and the second terminal of the organic light emitting diode OLED may be an anode terminal. In the embodiments, the anode terminal of the organic light emitting diode OLED may correspond to a lower electrode 290 of FIG. 6, and the cathode terminal of the organic light emitting diode OLED may correspond to an upper electrode 340 of FIG. 6.

The first transistor TR1 may generate the driving current ID. In the embodiments, the first transistor TR1 may operate in a saturation region. In this case, the first transistor TR1 may generate the driving current ID based on a voltage difference between the gate terminal and the source terminal of the first transistor TR1. In addition, gray levels may be expressed based on a magnitude of the driving current ID supplied to the organic light emitting diode OLED. In some embodiments, the first transistor TR1 may operate in a linear region. In this case, the gray levels may be expressed based on a sum of a time during which the driving current is supplied to the organic light emitting diode OLED within one frame.

The gate terminal of the second transistor TR2 may receive a gate signal GW. The first terminal of the second transistor TR2 may receive a data signal DATA. The second terminal of the second transistor TR2 may be connected to the first terminal of the first transistor TR1. For example, the gate signal GW may be provided from the gate driver, and the gate signal GW may be applied to the gate terminal of the second transistor TR2 through the gate signal (GW) line. The second transistor TR2 may supply the data signal DATA to the first terminal of the first transistor TR1 during an activation period of the gate signal GW. In this case, the second transistor TR2 may operate in a linear region.

The gate terminal of the third transistor TR3 may receive the gate signal GW. The first terminal of the third transistor TR3 may be connected to the gate terminal of the first transistor TR1. The second terminal of the third transistor TR3 may be connected to the second terminal of the first transistor TR1. For example, the gate signal GW may be provided from the gate driver, and the gate signal GW may be applied to the gate terminal of the third transistor TR3 through the gate signal (GW) line. The third transistor TR3 may connect the gate terminal of the first transistor TR1 and the second terminal of the first transistor TR1 during the activation period of the gate signal GW.

An input terminal of the initialization voltage line to which an initialization voltage VINT is provided may be connected to the first terminal of the fourth transistor TR4 and the first terminal of the seventh transistor TR7, and an output terminal of the initialization voltage line may be connected to the second terminal of the fourth transistor TR4 and a first terminal of the storage capacitor CST.

The gate terminal of the fourth transistor TR4 may receive a gate initialization signal GI. The first terminal of the fourth transistor TR4 may receive the initialization voltage VINT. The second terminal of the fourth transistor TR4 may be connected to the gate terminal of the first transistor TR1. The fourth transistor TR4 may supply the initialization voltage VINT to the gate terminal of the first transistor TR1 during an activation period of the gate initialization signal GI. In this case, the fourth transistor TR4 may operate in a linear region. In other words, the fourth transistor TR4 may initialize the gate terminal of the first transistor TR1 to the initialization voltage VINT during the activation period of the gate initialization signal GI. In the embodiments, the initialization voltage VINT may have a voltage level that is sufficiently lower than a voltage level of the data signal DATA maintained by the storage capacitor CST in a previous frame, and the initialization voltage VINT may be supplied to the gate terminal of the first transistor TR1. In other embodiments, the initialization voltage may have a voltage level that is sufficiently higher than the voltage level of the data signal maintained by the storage capacitor in the previous frame, and the initialization voltage may be applied to the gate terminal of the first transistor. In the embodiments, the gate initialization signal GI may be substantially the same as the gate signal GW of one horizontal time before.

The gate terminal of the fifth transistor TR5 may receive an emission control signal EM. The first terminal of the fifth transistor TR5 may be connected to the high power voltage (ELVDD) line. The second terminal of the fifth transistor TR5 may be connected to the first terminal of the first transistor TR1. For example, the emission control signal EM may be provided from an emission control driver, and the emission control signal EM may be applied to the gate terminal of the fifth transistor TR5 through the emission control signal (EM) line. The fifth transistor TR5 may supply the high power voltage ELVDD to the first terminal of the first transistor TR1 during an activation period of the emission control signal EM. On the contrary, the fifth transistor TR5 may cut off the supply of the high power voltage ELVDD during an inactivation period of the emission control signal EM. In this case, the fifth transistor TR5 may operate in a linear region. Since the fifth transistor TR5 supplies the high power voltage ELVDD to the first terminal of the first transistor TR1 during the activation period of the emission control signal EM, the first transistor TR1 may generate the driving current ID. In addition, since the fifth transistor TR5 cuts off the supply of the high power voltage ELVDD during the inactivation period of the emission control signal EM, the data signal DATA supplied to the first terminal of the first transistor TR1 may be supplied to the gate terminal of the first transistor TR1.

The gate terminal of the sixth transistor TR6 (e.g., the semiconductor element 250 of FIG. 6) may receive the emission control signal EM. The first terminal of the sixth transistor TR6 may be connected to the second terminal of the first transistor TR1. The second terminal of the sixth transistor TR6 may be connected to the first terminal of the organic light emitting diode OLED. The sixth transistor TR6 may supply the driving current ID generated by the first transistor TR1 to the organic light emitting diode OLED during the activation period of the emission control signal EM. In this case, the sixth transistor TR6 may operate in a linear region. In other words, since the sixth transistor TR6 supplies the driving current ID generated by the first transistor TR1 to the organic light emitting diode OLED during the activation period of the emission control signal EM, the organic light emitting diode OLED may output the light. In addition, since the sixth transistor TR6 electrically separates the first transistor TR1 and the organic light emitting diode OLED from each other during the inactivation period of the emission control signal EM, the data signal DATA supplied to the second terminal of the first transistor TR1 (precisely, a data signal that has been subject to threshold voltage compensation) may be supplied to the gate terminal of the first transistor TR1.

The gate terminal of the seventh transistor TR7 may receive a diode initialization signal GB. The first terminal of the seventh transistor TR7 may receive the initialization voltage VINT. The second terminal of the seventh transistor TR7 may be connected to the first terminal of the organic light emitting diode OLED. The seventh transistor TR7 may supply the initialization voltage VINT to the first terminal of the organic light emitting diode OLED during an activation period of the diode initialization signal GB. In this case, the seventh transistor TR7 may operate in a linear region. In other words, the seventh transistor TR7 may initialize the first terminal of the organic light emitting diode OLED to the initialization voltage VINT during the activation period of the diode initialization signal GB. In some embodiments, the gate initialization signal GI and the diode initialization signal GB may be substantially the same signal.

The storage capacitor CST may include a first terminal and a second terminal. The storage capacitor CST may be connected between the high power voltage (ELVDD) line and the gate terminal of the first transistor TR1. For example, the first terminal of the storage capacitor CST may be connected to the gate terminal of the first transistor TR1, and the second terminal of the storage capacitor CST may be connected to the high power voltage (ELVDD) line. The storage capacitor CST may maintain a voltage level of the gate terminal of the first transistor TR1 during an inactivation period of the gate signal GW. The inactivation period of the gate signal GW may include the activation period of the emission control signal EM, and the driving current ID generated by the first transistor TR1 may be supplied to the organic light emitting diode OLED during the activation period of the emission control signal EM. Therefore, the driving current ID generated by the first transistor TR1 may be supplied to the organic light emitting diode OLED based on the voltage level maintained by the storage capacitor CST.

However, although the sub-pixel SP according to the present invention has been described as including seven transistors and one storage capacitor, the configuration of the present invention is not limited thereto. For example, the sub-pixel SP may have a configuration including at least one transistor and at least one storage capacitor.

Figure 5:
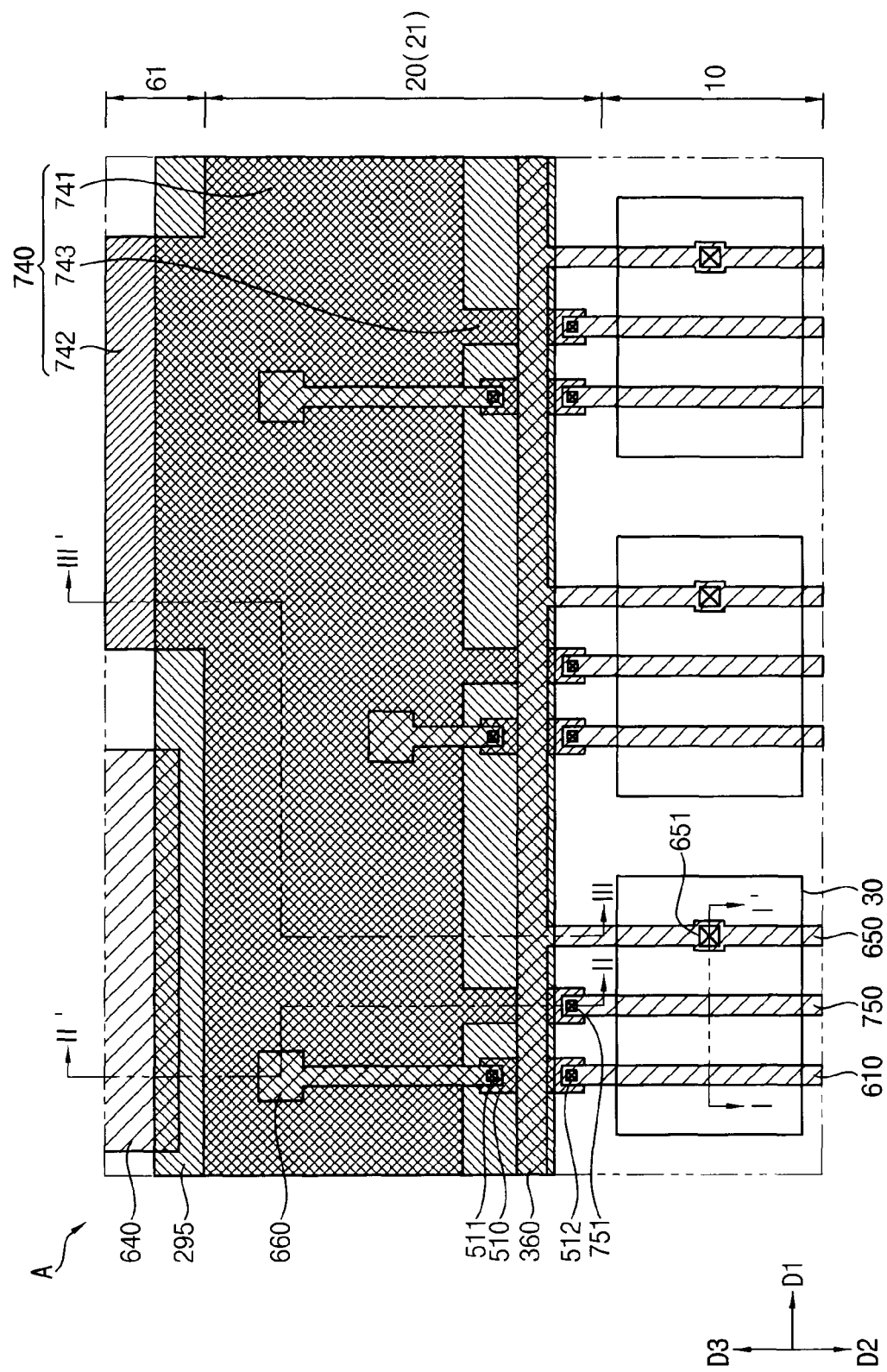
FIG. 5 is a partially enlarged plan view showing a region A of FIG. 1.
Figure 6:
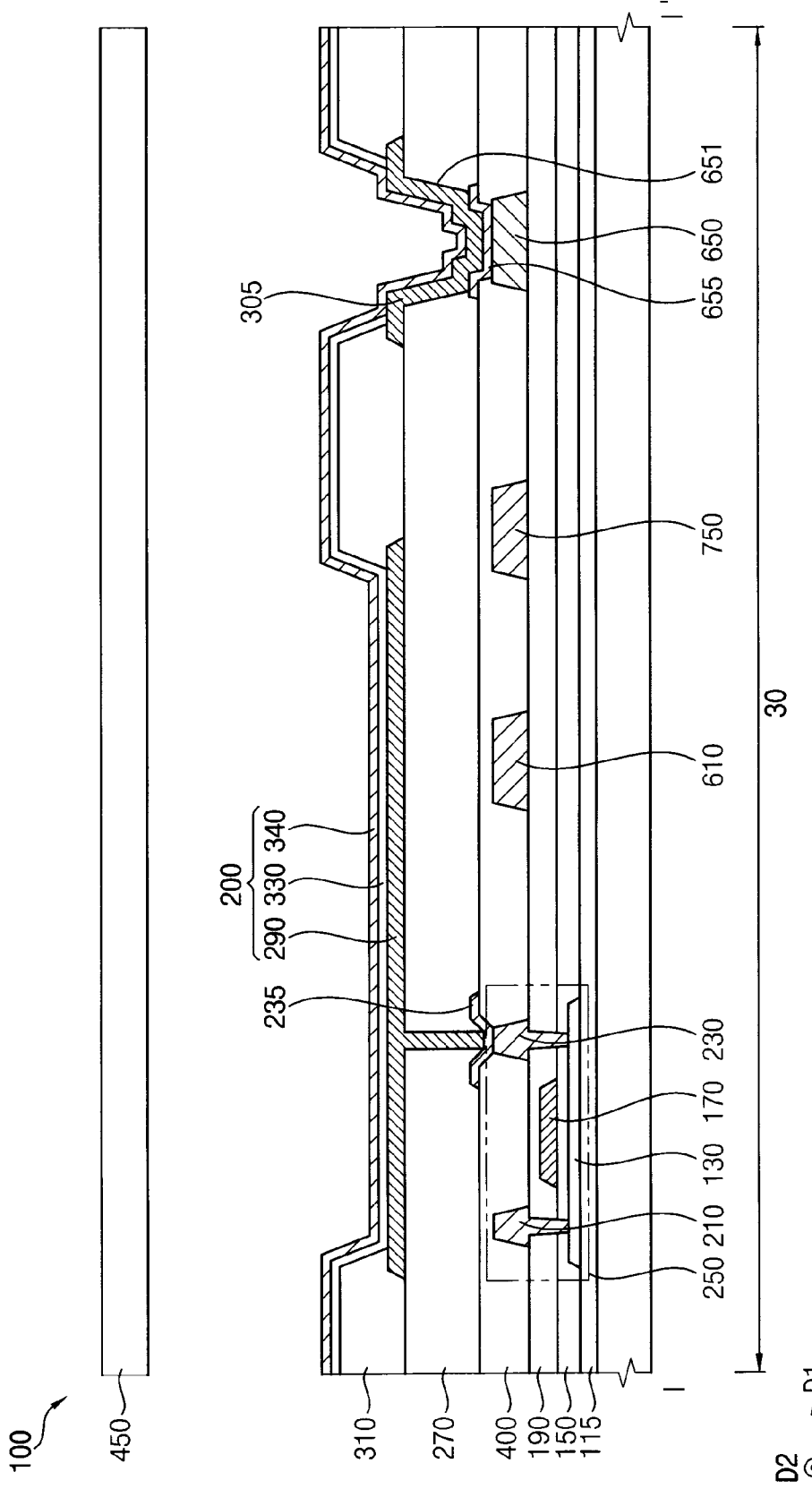
FIG. 6 is a cross-sectional view taken along line I-I' of FIG. 5.
Figure 7:
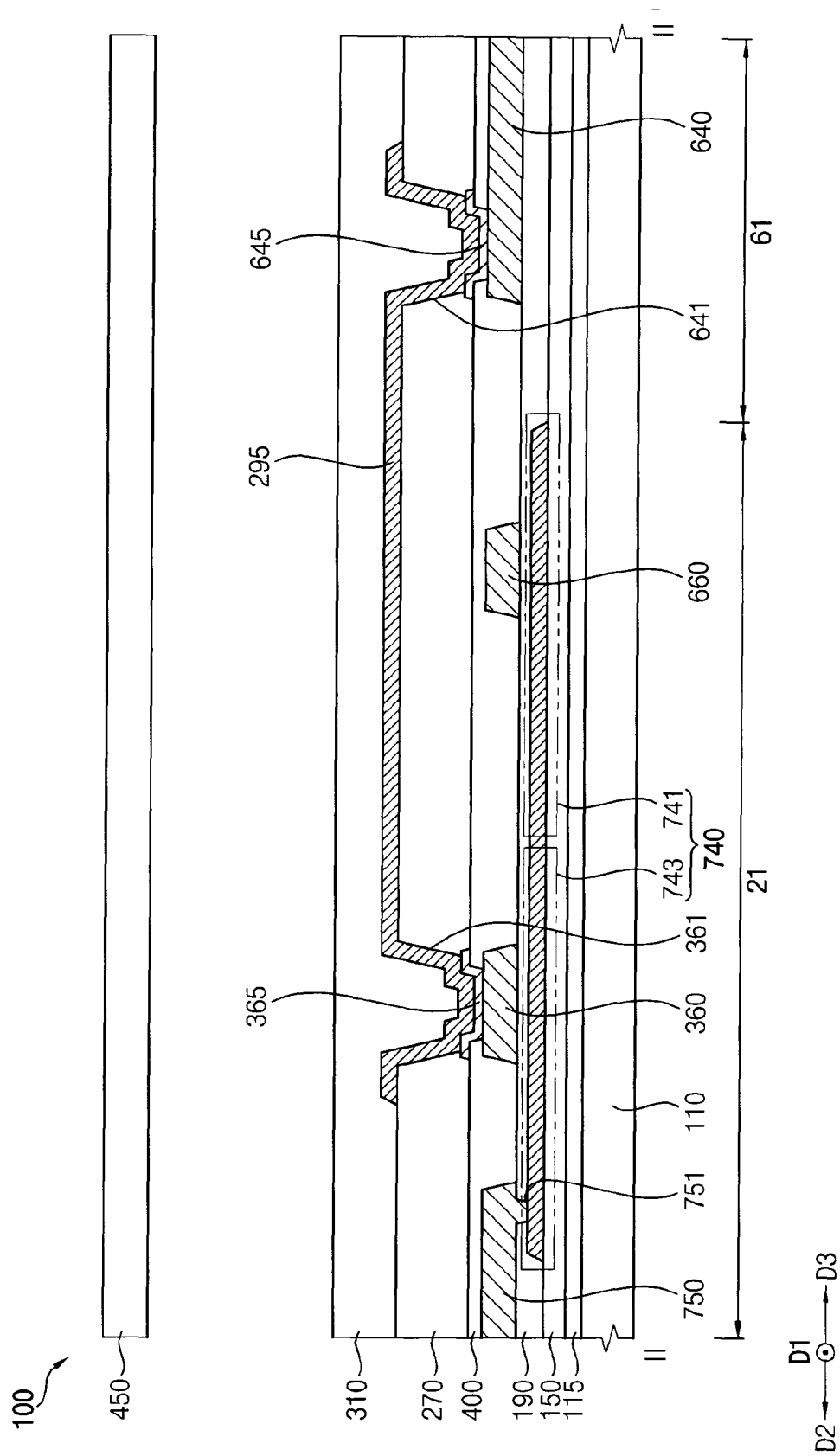
FIG. 7 is a cross-sectional view taken along line II-II' of FIG. 5.

FIG. 5 is a partially enlarged plan view showing a region A of FIG. 1, FIG. 6 is a cross-sectional view taken along line I-I' of FIG. 5; FIG. 7 is a cross-sectional view taken along line II-II' of FIG. 5; and FIG. 8 is a cross-sectional view taken along line III-III' of FIG. 5.

Referring to FIGS. 5, 6, 7, and 8, the display device 100 may further include a substrate 110, a buffer layer 115, a semiconductor element 250, a protective insulating layer 400, a first upper power line 640, a second upper power line 740, upper inspection pads 660, a conductive member 360, a conductive pattern 510, a first connection pattern 365, a second connection pattern 645, a third connection pattern 235, a fourth connection pattern 655, a first sub-power line 650, a second sub-power line 750, a signal line 610, a sub-pixel structure 200, an upper connection member 295, a first electrode pattern 305, a pixel defining layer 310, an encapsulation substrate 450, and the like. In this case, the semiconductor element 250 may include an active layer 130, a gate insulating layer 150, a gate electrode 170, an interlayer insulating layer 190, a source electrode 210, and a drain electrode 230, and the sub-pixel structure 200 may include a lower electrode 290, a light emitting layer 330, and an upper electrode 340.

The substrate 110 including transparent or opaque materials may be provided. The substrate 110 may include a quartz substrate, a synthetic quartz substrate, a calcium fluoride substrate, a fluorine-doped quartz substrate (F-doped quartz substrate), a soda lime glass substrate, a non-alkali glass substrate, and the like. In some embodiments, the substrate 110 may be configured as a transparent resin substrate having flexibility. In the embodiments, the substrate 110 may have a configuration in which a first organic layer, a first barrier layer, a second organic layer, and a second barrier layer are sequentially stacked. The first barrier layer and the second barrier layer may include an inorganic material such as silicon oxide, and may block water and/or moisture penetrating through the first and second organic layers. In addition, the first organic layer an d the second organic layer may include an organic material having flexibility, such as a polyimide-based resin.

Figure 8:
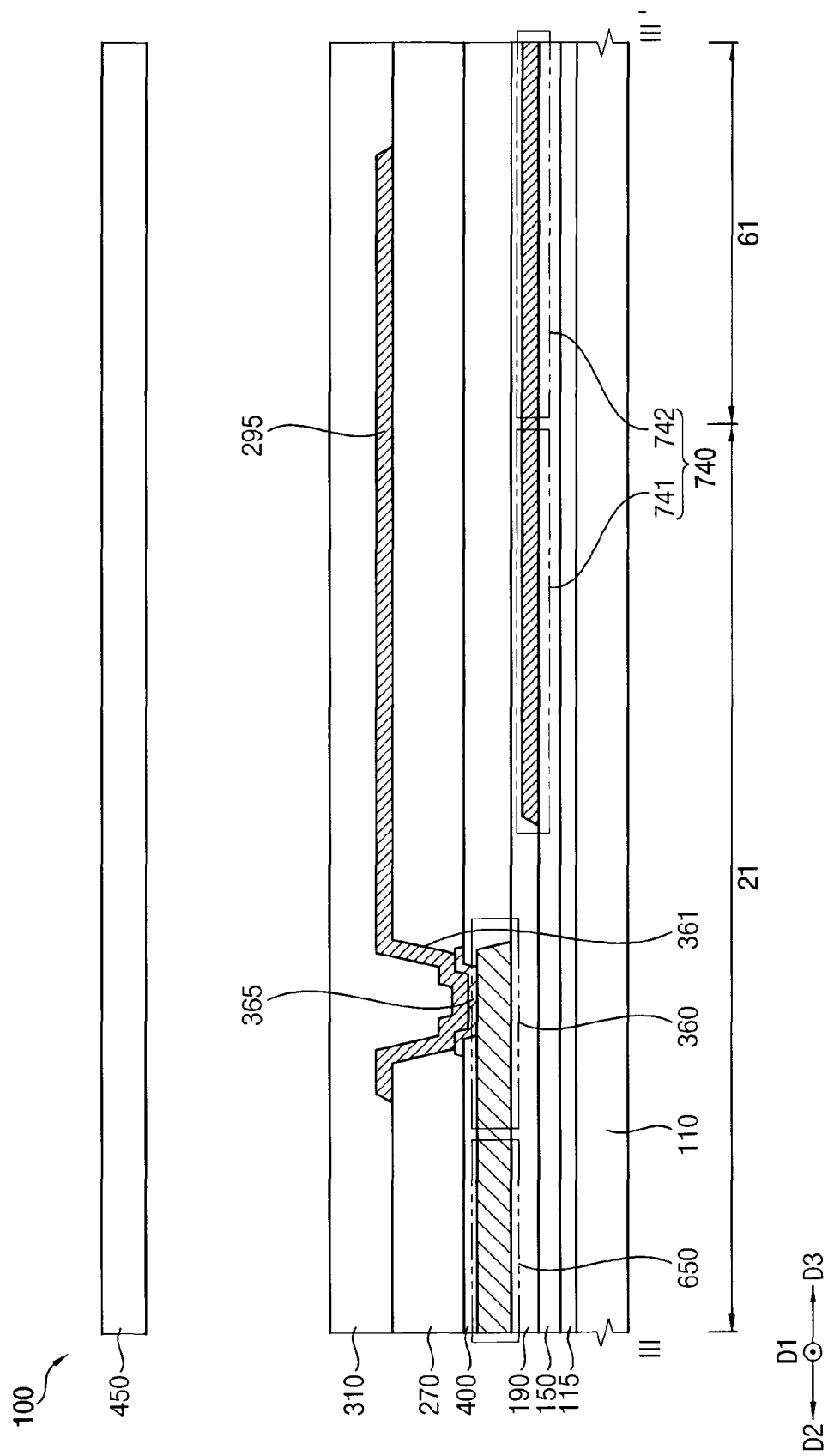
FIG. 8 is a cross-sectional view taken along line III-III' of FIG. 5.

Since the display device 100 includes a display area 10 in which a plurality of sub-pixel areas 30 are arranged, a peripheral area 20 including a first peripheral area 21 and a second peripheral area 22, a first pad area 61, and a second pad area 62, as shown in FIGS. 6, 7, and 8, the substrate 110 may also be divided into a display area 10 in which a plurality of sub-pixel areas 30 are arranged, a peripheral area 20 including a first peripheral area 21 and a second peripheral area 22, a first pad area 61, and a second pad area 62 (see FIG. 1).

The buffer layer 115 may be disposed on the substrate 110. The buffer layer 115 may be dis posed over the whole of the display area 10, the peripheral area 20, the first pad area 61, and the second pad area 62 on the substrate 110. For example, the buffer layer 115 may prevent metal atoms or impurities from diffusing from the substrate 110 to the semiconductor element 250, and may control a heat transfer rate during a crystallization process for forming the active layer 130 to obtain a substantially uniform active layer 130. In addition, when a surface of the substrate 110 is not uniform, the buffer layer 115 may serve to improve flatness of the surface of the substrate 110. Depending on a type of the substrate 110, at least two buffer layers 115 may be provided on the substrate 110, or the buffer layer 115 may not be provided. The buffer layer 115 may include a silicon compound, metal oxide, and the like. The buffer layer 115 may include silicon oxide ($SiO_x$), silicon nitride ($SiN_x$), silicon oxynitride ($SiO_xN_y$), silicon oxycarbide ($SiO_xC_y$), silicon carbonitride ($SiC_xN_y$), aluminum oxide ($AlO_x$), aluminum nitride ($AlN_x$), tantalum oxide ($TaO_x$), hafnium oxide ($HfO_x$), zirconium oxide ($ZrO_x$), titanium oxide ($TiO_x$), and the like.

The active layer 130 may be disposed in the sub-pixel area 30 on the buffer layer 115. The active layer 130 may include a metal oxide semiconductor, an inorganic semiconductor (e.g., amorphous silicon or polysilicon), an organic semiconductor, or the like. The active layer 130 may include a source region, a drain region, and a channel region located between the source region and the drain region.

The gate insulating layer 150 may be disposed on the active layer 130. The gate insulating layer 150 may be disposed in the display area 10, the peripheral area 20, the first pad area 61, and the second pad area 62 on the buffer layer 115. For example, the gate insulating layer 150 may sufficiently cover the active layer 130 on the buffer layer 115, and may have a substantially flat top surface without creating a step around the active layer 130. In some embodiments, the gate insulating layer 150 may be disposed along a prof ile of the active layer 130 with a uniform thickness to cover the active layer 130 on the buffer layer 115. The gate insulating layer 150 may include a silicon compound, metal oxide, and the like. In other embodiments, the gate insulating layer 150 may have a multilayer structure having a plurality of insulating layers including mutually different materials, and the insulating layers may have mutually different thicknesses.

The gate electrode 170 may be disposed in the sub-pixel area 30 on the gate insulating layer 150. The gate electrode 170 may be disposed on a portion of the gate insulating layer 150 under which the active layer 130 is located (e.g., to overlap the channel region of the active layer 130). The gate electrode 170 may include a metal, an alloy, metal nitride, conductive metal oxide, a transparent conductive material, and the like. These may be used alone or in combination with each other. In other embodiments, the gate electrode 170 may have a multilayer structure including a plurality of metal layers formed of mutually different materials, and the metal layers may have mutually different thicknesses.

The second upper power line 740 may be disposed in the first pad area 61 and the first peripheral area 21 on the gate insulating layer 150. In the embodiments, the second upper power line 740 may be located at a lower level than the first upper power line 640 and the conductive member 360, and may be electrically connected to the second power circuit board 941 disposed in the first pad area 61 of FIG. 2 through the first pad electrodes 471. In addition, the second upper power line 740 may include a first line extension part 741, a second line extension part 742, and a third line extension part 743. For example, the first line extension part 741 may be located in the first peripheral area 21, and may extend in the first direction D1. In other words, the first line extension part 741 may overlap the first peripheral area 21. The second line extension part 742 may extend from one side of the first line extension part 741 in a third direction D3 that is a direction from the first peripheral area 21 to the first pad area 61 (e.g., a direction opposite to the second direction D2) so as to be located in the first pad area 61. In other words, the second line extension part 742 may protrude from the one side of the first line extension part 741 in the third direction D3, and may extend in the third direction D3 so as to be electrically connected to the second power circuit board 941 through the first pad electrodes 471. The third line extension part 743 may extend from an opposite side of the first line extension part 741 in the second direction D2 that is a direction from the first peripheral area 21 to the display area 10, and may intersect the conductive member 360. In other words, the third line extension part 743 may protrude from the opposite side of the first line extension part 741 in the second direction D2, and may be located under the conductive member 360. Moreover, the first line extension part 741, the second line extension part 742, and the third line extension part 743 may be formed integrally with each other.

The second power (e.g., the high power voltage ELVDD of FIG. 4) may be provided to the second upper power line 740. The second power may be provided to the lower electrode 290 through the second upper power line 740 and the second sub-power line 750. The second sub-power line 750 may include a metal, an alloy, metal nitride, conductive metal oxide, a transparent conductive material, and the like. These may be used alone or in combination with each other. In some embodiments, the second upper power lines 740 may have a multilayer structure including a plurality of metal layers formed of mutually different materials, and the metal layers may have mutually different thicknesses.

However, although one third line extension part 743 has been described as protruding from the first line extension part 741 in the second direction D2 for convenience, the second upper power line 740 may include one first line extension part 741 and a plurality of third line extension parts 743 as shown in FIG. 5. In addition, each of the third line extension parts 743 may be electrically connected to the second sub-power line 750 in the first peripheral area 21, and the second sub-power line 750 may extend in the second direction D2 and may be disposed in the sub-pixel area 30.

The conductive pattern 510 may be disposed in parallel with the third line extension part 743 in the first peripheral area 21 on the gate insulating layer 150. In other words, the conductive pattern 510 may be disposed under the conductive member 360, and may intersect the conductive member 360. The conductive pattern 510 may electrically connect the upper inspection pad 660 and the signal line 610 through contact holes 511 and 512. The conductive pattern 510 may include a metal, an alloy, metal nitride, conductive metal oxide, a transparent conductive material, and the like. These may be used alone or in combination with each other. In other embodiments, the conductive pattern 510 may have a multilayer structure including a plurality of metal layers formed of mutually different materials, and the metal layers may have mutually different thicknesses. In the embodiments, the gate electrode 170, the conductive pattern 510, and the second upper power line 740 may be located on the same layer.

The interlayer insulating layer 190 may be disposed on the gate electrode 170, the conductive pattern 510, and the second upper power line 740. The interlayer insulating layer 190 may be disposed in the display area 10, the peripheral area 20, the first pad area 61, and the second pad area 62 on the gate insulating layer 150. In the embodiments, the interlayer insulating layer 190 may include: a contact hole 511 that exposes one side of the conductive pattern 510; a contact hole 512 that exposes an opposite side of the conductive pattern 510; and a contact hole 751 that exposes a portion of the third line extension part 743 that is adjacent to the display area 10. For example, the interlayer insulating layer 190 may sufficiently cover the gate electrode 170, the conductive pattern 510, and the second upper power line 740 on the gate insulating layer 150, and may have a substantially flat top surface without creating a step around the gate electrode 170 and the second upper power line 740. In some embodiments, the interlayer insulating layer 190 may be disposed along a profile of the gate electrode 170, the conductive pattern 510, and the second upper power line 740 with a uniform thickness to cover the gate electrode 170, the conductive pattern 510, and the second upper power line 740 on the gate insulating layer 150. The interlayer insulating layer 190 may include a silicon compound, metal oxide, and the like. In other embodiments, the interlayer insulating layer 190 may have a multilayer structure having a plurality of insulating layers including mutually different materials, and the insulating layers may have mutually different thicknesses.

The source electrode 210 and the drain electrode 230 may be disposed in the sub-pixel area 30 on the interlayer insulating layer 190. The source electrode 210 may be connected to the source region of the active layer 130 through a contact hole formed by removing first portions of the gate insulating layer 150 and the interlayer insulating layer 190, and the drain electrode 230 may be connected to the drain region of the active layer 130 through a contact hole formed by removing second portions of the gate insulating layer 150 and the interlayer insulating layer 190. Each of the source electrode 210 and the drain electrode 230 may include a metal, an alloy, metal nitride, conductive metal oxide, a transparent conductive material, and the like. These may be used alone or in combination with each other. In other embodiments, each of the source electrode 210 and the drain electrode 230 may have a multilayer structure including a plurality of metal layers formed of mutually different materials, and the metal layers may have mutually different thicknesses.

Accordingly, the semiconductor element 250 including the active layer 130, the gate insulating layer 150, the gate electrode 170, the interlayer insulating layer 190, the source electrode 210, and the drain electrode 230 may be provided.

However, although the semiconductor element 250 has been described as having a top gate structure, the inventive concepts are not limited thereto. For example, the semiconductor element 250 may have a bottom gate structure.

In addition, although the display device 100 has been described as including one semiconductor element, the inventive concepts are not limited thereto. For example, the display device 100 may include at least one semiconductor element and at least one storage capacitor.

The conductive member 360 may be disposed in the first peripheral area 21 and the display area 10 on the interlayer insulating layer 190. For example, the conductive member 360 may include a first extension part and a second extension part. In this case, the first extension part may extend in the first direction D1 in the first peripheral area 21, and may be located in parallel with the first line extension part 741. For example, the first line extension part 741 may be located close to the first pad area 61 in the first peripheral area 21, and the first extension part may be located close to the display area 10 in the first peripheral area 21. As described above, the first contact hole 361 may be located on the first extension part of the conductive member 360, and the first contact hole 361 may be located to correspond to the first extension part. In other words, the first contact hole 361 may extend in the first direction D1, and may expose a portion of a top surface of the first extension part. The second extension part may extend from one side of the first extension part in the second direction D2, and may be located in a portion of the first peripheral area 21 and the display area 10. In addition, the second extension part may be disposed in the sub-pixel area 30, and a third contact hole 651 may be located on the second extension part in the sub-pixel area 30. The second extension part may be defined as the first sub-power line 650. The first extension part and the second extension part may be forme d integrally with each other.

In embodiments, the conductive member 360 may receive the first power (e.g., the low power voltage ELVSS of FIG. 4) applied to the first upper power line 640 through the upper connection member 295, and the first power may be provided to the upper electrode 340 through the first sub-power line 650. The conductive member 360 may include a metal, an alloy, metal nitride, conductive metal oxide, a transparent conductive material, and the like. For example, the conductive member 360 may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), an aluminum-containing alloy, aluminum nitride ($AlN_x$), a silver-containing alloy, tungsten nitride ($WN_x$), a copper-containing alloy, a molybdenum-containing alloy, titanium nitride ($TiN_x$), chromium nitride ($CrN_x$), tantalum nitride ($TaN_x$), strontium ruthenium oxide ($SrRu_xO_y$), zinc oxide ($ZnO_x$), indium tin oxide (ITO), tin oxide ($SnO_x$), indium oxide ($InO_x$), gallium oxide ($GaO_x$), indium zinc oxide (IZO), and the like. These may be used alone or in combination with each other. In some embodiments, the conductive member 360 may have a multilayer structure including a plurality of metal layers formed of mutually different materials, and the metal layers may have mutually different thicknesses.

However, although one second extension part has been described as extending from the first extension part in the second direction D2 in the display area 10 for convenience, the conductive member 360 may include one first extension part and a plurality of second extension parts as shown in FIG. 5. In addition, each of the second extension parts may be disposed in the sub-pixel area 30.

The upper inspection pads 660 may be disposed in the first peripheral area 21 on the interlayer insulating layer 190 to overlap the first line extension part 741 of the second upper power line 740. The upper inspection pads 660 may be located on the same layer as the first upper power line 640 and the conductive member 360, and may be arranged in the first direction D1 in the first peripheral area 21. Each of the upper inspection pads 660 may further include an extension part extending in the second direction D2, in which one side of the extension part may be connected to the upper inspection pad 660, and an opposite side of the extension part may be adjacent to the conductive member 360. The opposite side of the extension part may be electrically connected to the signal line 610 through the conductive pattern 510. For example, the upper inspection pads 660 may function as OS pads configured to inspect an open state and a short of a data line (e.g., the signal line 610). In some embodiments, for accurate inspection, an opening may be formed in the second upper power line 740 located under each of the upper inspection pads 660. Each of the upper inspection pads 660 may include a metal, an alloy, metal nitride, conductive metal oxide, a transparent conductive material, and the like. These may be used alone or in combination with each other. In other embodiments, each of the upper inspection pads 660 may have a multilayer structure including a plurality of metal layers formed of mutually different materials, and the metal layers may have mutually different thicknesses.

The first upper power line 640 may be disposed in the first pad area 61 on the interlayer insulating layer 190. In the embodiments, the first upper power line 640 may be located at a higher level than the second upper power line 740, and may be electrically connected to the first power circuit board 841 disposed in the first pad area 61 of FIG. 2. In other words, one side of the first upper power line 640 may be electrically connected to the first power circuit board 841 through the first pad electrodes 471, and an opposite side of the first upper power line 640 may be electrically connected to the upper connection member 295. In this case, a second contact hole 641 may be located on the opposite side of the first upper power line 640 so that the opposite side of the first upper power line 640 may be electrically connected to the upper connection member 295, and the second contact hole 641 may expose a portion of a top surface of the first upper power line 640. In addition, the first upper power line 640 may be disposed in parallel with the second line extension part 742.

The first power (e.g., the low power voltage ELVSS of FIG. 4) may be provided to the first upper power line 640. The first power may be provided to the upper electrode 340 through the first upper power line 640, the upper connection member 295, the conductive member 360, and the first sub-power line 650. The first upper power line 640 may include a metal, an alloy, metal nitride, conductive metal oxide, a transparent conductive material, and the like. These may be used alone or in combination with each other. In some embodiments, the first upper power line 640 may have a multilayer structure including a plurality of metal layers formed of mutually different materials, and the metal layers may have mutually different thicknesses.

The signal line 610 may be disposed in a portion of the first peripheral area 21 and the display area 10 on the interlayer insulating layer 190, and may extend in the second direction D2. The data signal DATA of FIG. 5 may be applied to the signal line 610, and the signal line 610 may correspond to the data signal (DATA) line of FIG. 5. In other words, the signal line 610 may be electrically connected to the semiconductor element 250 and another semiconductor element (e.g., the second transistor TR2 of FIG. 4) disposed in the sub-pixel area 30, and may provide the data signal DATA to the semiconductor element. The signal line 610 may include a metal, an alloy, metal nitride, conductive metal oxide, a transparent conductive material, and the like. These may be used alone or in combination with each other. In other embodiments, the signal line 610 may have a multilayer structure including a plurality of metal layers formed of mutually different materials, and the metal layers may have mutually different thicknesses.

The second sub-power line 750 may be disposed in parallel with the signal line 610 in a portion of the first peripheral area 21 and the display area 10 on the interlayer insulating layer 190, and may extend in the second direction D2. The second sub-power line 750 may be electrically connected to the second upper power line 740 through the contact hole 751 in the first peripheral area 21, and the second power may be applied to the second sub-power line 750. For example, the second sub-power line 750 may correspond to the high power voltage (ELVDD) line of FIG. 4. In other words, in another sectional view of the display device 100, the second sub-power line 750 may be electrically connected to the lower electrode 290 disposed in the sub-pixel area 30, and may provide the second power (e.g., the high power voltage ELVDD of FIG. 4) to the lower electrode 290. The second sub-power line 750 may include a metal, an alloy, metal nitride, conductive metal oxide, a transparent conductive material, and the like. These may be used alone or in combination with each other. In other embodiments, the second sub-power line 750 may have a multilayer structure including a plurality of metal layers formed of mutually different materials, and the metal layers may have mutually different thicknesses.

The first sub-power line 650 may be disposed in parallel with the signal line 610 and the second sub-power line 750 in a portion of the first peripheral area 21 and the display area 10 on the interlayer insulating layer 190, and may extend in the second direction D2. As described above, the first sub-power line 650 may extend from the first extension part of the conductive member 360 in the first peripheral area 21, and the first power may be applied to the first sub-power line 650. For example, the first sub-power line 650 may correspond to the low power voltage (ELVSS) line of FIG. 4. As shown in FIG. 6, the first sub-power line 650 may be electrically connected to the upper electrode 340 through the third contact hole 651, and may provide the first power (e.g., the low power voltage ELVSS of FIG. 4) to the upper electrode 340. In the embodiments, the conductive member 360, the first upper power line 640, the upper inspection pads 660, the signal line 610, the second sub-power line 750, and the first sub-power line 650 may be located on the same layer.

The protective insulating layer 400 may be disposed in the display area 10, the peripheral area 20, the first pad area 61, and the second pad area 62 on the source and drain electrodes 210 and 230, the signal line 610, the second sub-power line 750, the first sub-power line 650, the conductive member 360, the upper inspection pads 660, and the first upper power line 640. In the embodiments, the protective insulating layer 400 may include: a contact hole that exposes a portion of a top surface of the drain electrode 230; a contact hole that exposes a portion of a top surface of the first sub-power line 650; a contact hole that exposes a portion of a top surface of the conductive member 360; a contact hole that exposes a portion of a top surface of the first upper power line 640; and the like.

The protective insulating layer 400 may sufficiently cover the source and drain electrodes 210 and 230, the signal line 610, the second sub-power line 750, the first sub-power line 650, the conductive member 360, the upper inspection pads 660, and the first upper power line 640 on the interlayer insulating layer 190, and may have a substantially flat top surface without creating a step around the source and drain electrodes 210 and 230, the signal line 610, the second sub-power line 750, the first sub-power line 650, the conductive member 360, the upper inspection pads 660, and the first upper power line 640. In some embodiments, the protective insulating layer 400 may be disposed along a profile of the source and drain electrodes 210 and 230, the signal line 610, the second sub-power line 750, the first sub-power line 650, the conductive member 360, the upper inspection pads 660, and the first upper power line 640 with a substantially uniform thickness to cover the source and drain electrodes 210 and 230, the signal line 610, the second sub-power line 750, the first sub-power line 650, the conductive member 360, the upper inspection pads 660, and the first upper power line 640 on the interlayer insulating layer 190. The protective insulating layer 400 may include a silicon compound, metal oxide, and the like. In other embodiments, the protective insulating layer 400 may have a multilayer structure having a plurality of insulating layers including mutually different materials, and the insulating layers may have mutually different thicknesses.

The first connection pattern 365 may be disposed in the contact hole that exposes the portion of the top surface of the conductive member 360, the second connection pattern 645 may be disposed in the contact hole that exposes the portion of the first upper power line 640, the third connection pattern 235 may be disposed in the contact hole that exposes the portion of the top surface of the drain electrode 230, and the fourth connection pattern 655 may be disposed in the contact hole that exposes the portion of the top surface of the first sub-power line 650. In other words, at least a portion of each of the first to fourth connection patterns 365, 645, 235, and 655 may be interposed between the protective insulating layer 400 and a planarization layer 270. The first connection pattern 365 may completely cover the conductive member 360 exposed by the contact hole, the second connection pattern 645 may completely cover the first upper power line 640 exposed by the contact hole, the third connection pattern 235 may completely cover the drain electrode 230 exposed by the contact hole, and the fourth connection pattern 655 may completely cover the first sub-power line 650 exposed by the contact hole. For example, in a method of manufacturing the display device 100, the conductive member 360, the second connection pattern 645, the first upper power line 640, and the drain electrode 230 may be formed by using copper, and each of the first to fourth connection patterns 365, 645, 235, and 655 may be formed by using indium tin oxide. After the planarization layer 270 is formed on the protective insulating layer 400, an etching process for forming contact holes of the planarization layer 270 overlapping the contact holes formed in the protective insulating layer 400 may be performed. The first to fourth connection patterns 365, 645, 235, and 655 may be provided to protect the conductive member 360, the second connection pattern 645, the first upper power line 640, and the drain electrode 230 while the etching process is performed. In some embodiments, each of the first to fourth connection patterns 365, 645, 235, and 655 may include a metal, an alloy, metal nitride, conductive metal oxide, a transparent conductive material, and the like. These may be used alone or in combination with each other. In other embodiments, each of the first to fourth connection patterns 365, 645, 235, and 655 may have a multilayer structure including a plurality of metal layers formed of mutually different materials, and the metal layers may have mutually different thicknesses.

The planarization layer 270 may be disposed on the first to fourth connection patterns 365, 645, 235, and 655. The planarization layer 270 may be disposed in the display area 10, the peripheral area 20, the first pad area 61, and the second pad area 62 on the protective insulating layer 400. The planarization layer 270 may have a contact hole overlapping the contact hole of the protective insulating layer 400 that exposes the portion of the top surface of the conductive member 360, and the contact holes may be defined as the first contact hole 361. In addition, the planarization layer 270 may have a contact hole overlapping the contact hole of the protective insulating layer 400 that exposes the portion of the first upper power line 640, and the contact holes may be defined as the second contact hole 641. Moreover, the planarization layer 270 may have a contact hole overlapping the contact hole of the protective insulating layer 400 that exposes the portion of the top surface of the first sub-power line 650, and the contact holes may be defined as the third contact hole 651. Meanwhile, the planarization layer 270 may have a contact hole overlapping the contact hole of the protective insulating layer 400 that exposes the portion of the top surface of the drain electrode 230, and the lower electrode 290 may be electrically connected to the semiconductor element 250 through the contact holes.

For example, the planarization layer 270 may have a relatively large thickness. In this case, the planarization layer 270 may have a substantially flat top surface. In order to implement such a flat top surface of the planarization layer 270, a planarization process may be additionally performed on the planarization layer 270. In some embodiments, the planarization layer 270 may be disposed along a profile of the first to fourth connection patterns 365, 645, 235, and 655 with a uniform thickness on the protective insulating layer 400. The first planarization layer 270 may be formed of an organic material or an inorganic material. In the embodiments, the planarization layer 270 may include an organic material. For example, the planarization layer 270 may include a photoresist, a polyacryl-based resin, a polyimide-based resin, a polyamide-based resin, a siloxane-based resin, an acryl-based resin, an epoxy-based resin, and the like.

The lower electrode 290 may be disposed in the sub-pixel area 30 on the planarization layer 270. The lower electrode 290 may include a metal, an alloy, metal nitride, conductive metal oxide, a transparent conductive material, and the like. These may be used alone or in combination with each other. In other embodiments, the lower electrode 290 may have a multilayer structure including a plurality of metal layers formed of mutually different materials, and the metal layers may have mutually different thicknesses.

The upper connection member 295 may be disposed in the first peripheral area 21 and the first pad area 61 on the planarization layer 270. The upper connection member 295 may extend in the first direction D1 in the first peripheral area 21, and may overlap a portion of the first upper power line 640 and the conductive member 360. The upper connection member 295 may electrically connect the conductive member 360 and the first upper power line 640 through the first contact hole 361 and the second contact hole 641. In other words, the first power applied to the first upper power line 640 may be provided to the conductive member 360 through the upper connection member 295. The upper connection member 295 may include a metal, an alloy, metal nitride, conductive metal oxide, a transparent conductive material, and the like. These may be used alone or in combination with each other. In some embodiments, the upper connection member 295 may have a multilayer structure including a plurality of metal layers formed of mutually different materials, and the metal layers may have mutually different thicknesses.

The first electrode pattern 305 may be disposed in the third contact hole 651. The first electrode pattern 305 may be disposed between the upper electrode 340 and the fourth connection pattern 655, and may completely cover the fourth connection pattern 655 exposed by the third contact hole 651. For example, in the method of manufacturing the display device 100, after the light emitting layer 330 is formed, a laser drilling process for removing the light emitting layer 330, which is formed on the first electrode pattern 305 to overlap the third contact hole 651, may be performed. The light emitting layer 330 formed on the first electrode pattern 305 may be removed through the laser drilling process. While the laser drilling process is performed, the first electrode pattern 305 may protect the fourth connection pattern 655. The first electrode pattern 305 may include a metal, an alloy, metal nitride, conductive metal oxide, a transparent conductive material, and the like. These may be used alone or in combination with each other. In other embodiments, the first electrode pattern 305 may have a multilayer structure including a plurality of metal layers formed of mutually different materials, and the metal layers may have mutually different thicknesses.

The pixel defining layer 310 may be disposed in the display area 10, the peripheral area 20, the first pad area 61, and the second pad area 62 on the planarization layer 270. The pixel defining layer 310 may cover both side portions of the lower electrode 290, and may expose a portion of a top surface of the lower electrode 290. In addition, the pixel defining layer 310 may cover both side portions of the first electrode pattern 305, and may expose a portion of a top surface of the first electrode pattern 305. Moreover, the pixel defining layer 310 may cover the upper connection member 295 in the first peripheral area 21 and the first pad area 61. The pixel defining layer 310 may be formed of an organic material or an inorganic material. In the embodiments, the pixel defining layer 310 may include an organic material.

The light emitting layer 330 may be disposed in the display area 10 on the pixel defining layer 310, the lower electrode 290, and a portion of the first electrode pattern 305. As described above, the light emitting layer 330 may expose the portion of the top surface of the first electrode pattern 305 through the laser drilling process. In other words, the light emitting layer 330 may not be disposed in a portion in which the third contact hole 651 is formed. The light emitting layer 330 may have a multilayer structure including an organic light emission layer EML, a hole injection layer HIL, a hole transport layer HTL, an electron transport layer ETL, an electron injection layer EIL, and the like. The organic light emission layer EML of the light emitting layer 330 may be formed by using at least one of light emitting materials for emitting different color lights (i.e., a red light, a green light, a blue light, etc.) according to sub-pixels. Alternatively, the organic light emission layer EML of the light emitting layer 330 may be formed by stacking a plurality of light emitting materials for generating different color lights such as a red light, a green light, and a blue light to emit a white light as a whole. In this case, a color filter may be disposed on the light emitting layer 330 disposed on the lower electrode 290. The color filter may include at least one of a red color filter, a green color filter, and a blue color filter. In some embodiments, the color filter may include a yellow color filter, a cyan color filter, and a magenta color filter. The color filter may include a photosensitive resin or a color photoresist.

The upper electrode 340 may be disposed in the display area 10 on the substrate 110. For example, the upper electrode 340 may be disposed on the light emitting layer 330 in the display area 10, and may make direct contact with the first electrode pattern 305 exposed by the light emitting layer 330. In other words, the upper electrode 340 may be disposed along a profile of the light emitting layer 330 and the first electrode pattern 305. As described above, the first power applied to the first upper power line 640 may be transmitted to the upper electrode 340 through the second connection pattern 645, the upper connection member 295, the first connection pattern 365, the conductive member 360, the first sub-power line 650, the fourth connection pattern 655, and the first electrode pattern 305. The upper electrode 340 may include a metal, an alloy, metal nitride, conductive metal oxide, a transparent conductive material, and the like. These may be used alone or in combination with each other. In other embodiments, the upper electrode 340 may have a multilayer structure including a plurality of metal layers formed of mutually different materials, and the metal layers may have mutually different thicknesses.

Accordingly, the sub-pixel structure 200 including the lower electrode 290, the light emitting layer 330, and the upper electrode 340 may be provided.

The encapsulation substrate 450 may be disposed in the display area 10 on the upper electrode 340. The encapsulation substrate 450 may face the substrate 110, and may not be disposed in the first pad area 61 and the second pad area 62. The encapsulation substrate 450 may include substantially the same material as the substrate 110. For example, the encapsulation substrate 450 may include a quartz substrate, a synthetic quartz substrate, a calcium fluoride substrate, a fluorine-doped quartz substrate, a soda lime glass substrate, a non-alkali glass substrate, and the like. In other embodiments, the encapsulation substrate 450 may include a transparent inorganic material or flexible plastic. For example, the encapsulation substrate 450 may include a transparent resin substrate having flexibility. In this case, in order improve flexibility of the display device 100, the encapsulation substrate 450 may have a structure in which at least one inorganic layer and at least one organic layer are alternately stacked. The stacked structure may include a first inorganic layer, an organic layer, and a second inorganic layer.

For example, a conventional display device may have an enlarged size and a high resolution. When the display device is driven with a high luminance, a current may be concentrated in the first upper power line 640 disposed in the first peripheral area 21 and the first pad area 61 so that a temperature may be increased (e.g., a heat generation phenomenon). In this case, the heat generation phenomenon may cause a short of the first upper power line 640 or deformation of an insulating layer located around the first upper power line 640. In addition, as the display area 10 is widened, a voltage drop (IR drop) phenomenon may occur. In addition, a defect of the conventional display device may be caused by the heat generation phenomenon of the first upper power line 640 occurring in the second peripheral area 22 and the voltage drop phenomenon occurring in the display area 10.

In embodiments, since the display device 100 includes the conductive member 360, and the first contact hole 361 formed on the conductive member 360 has a relatively wide area, a contact area between the upper connection member 295 and the conductive member 360 may be relatively increased. In addition, since the upper electrode 340 is electrically connected to the first upper power line 640 through the third contact hole 651, the upper electrode 340 may receive the first power. Accordingly, according to the display device 100, both the heat generation phenomenon and the voltage drop phenomenon may be reduced.

Figure 9:
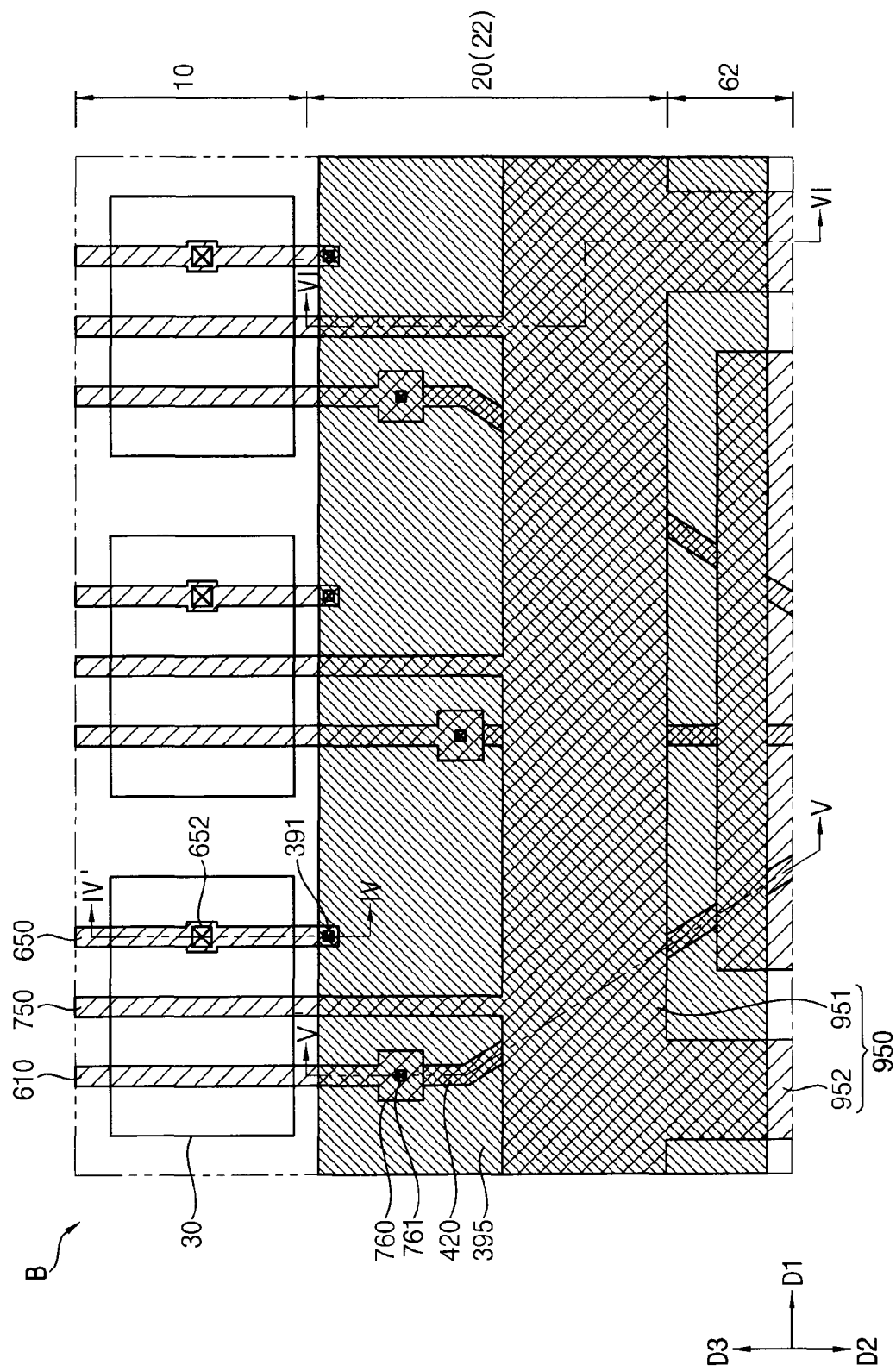
FIG. 9 is a partially enlarged plan view showing a region B of FIG. 1.
Figure 10:
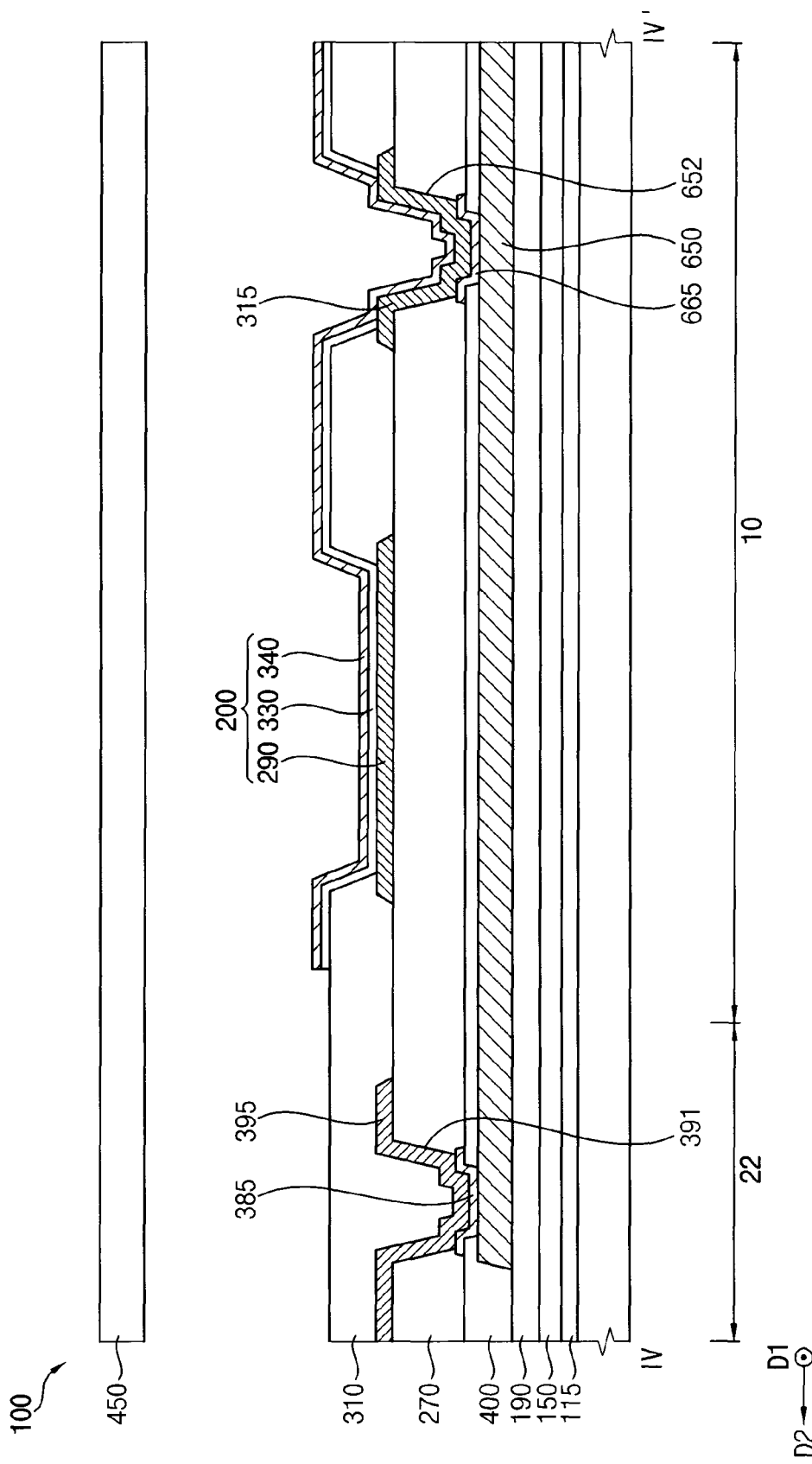
FIG. 10 is a cross-sectional view taken along line IV-IV' of FIG. 9.
Figure 11:
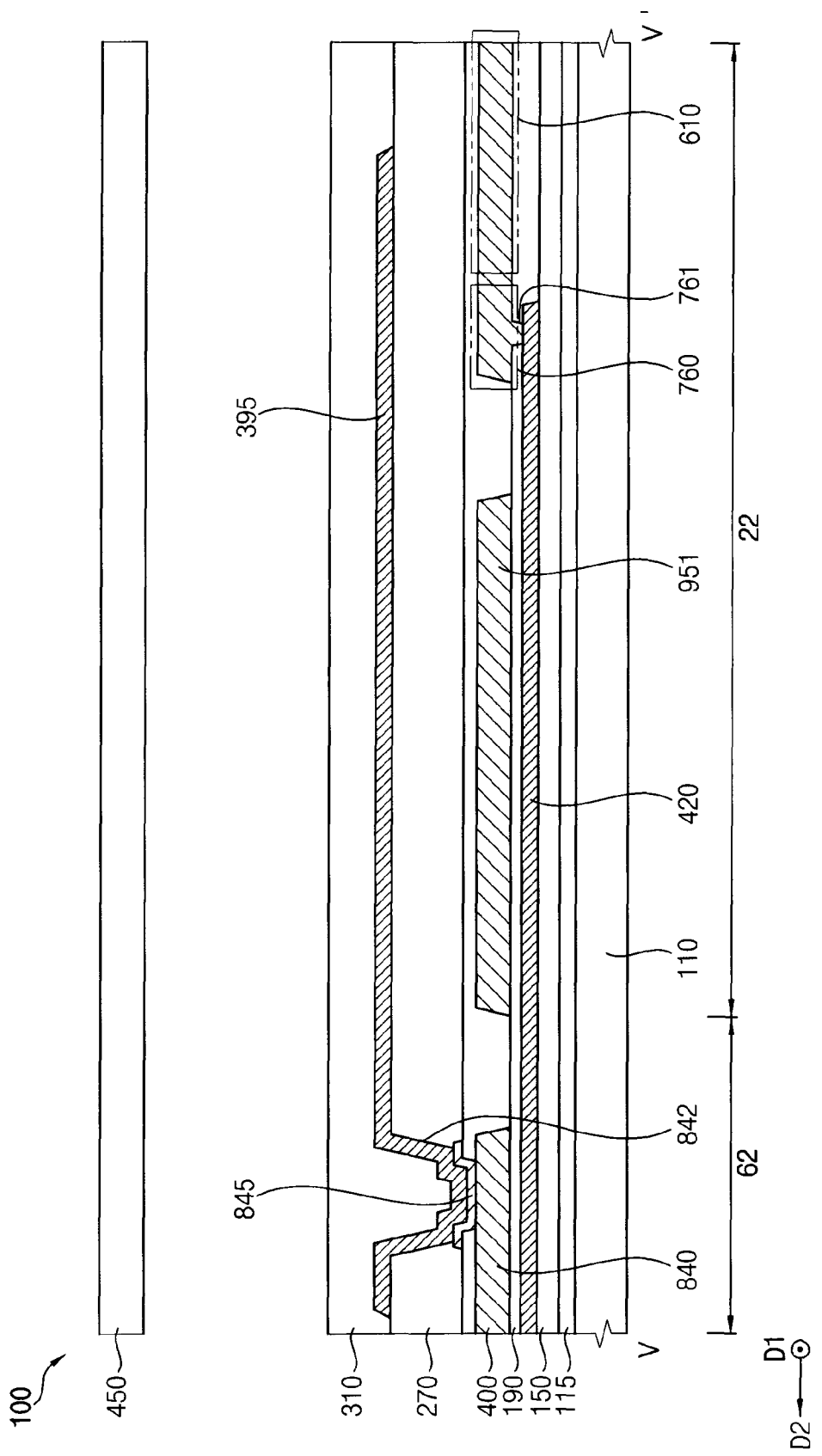
FIG. 11 is a cross-sectional view taken along line V-V' of FIG. 9.
Figure 12:
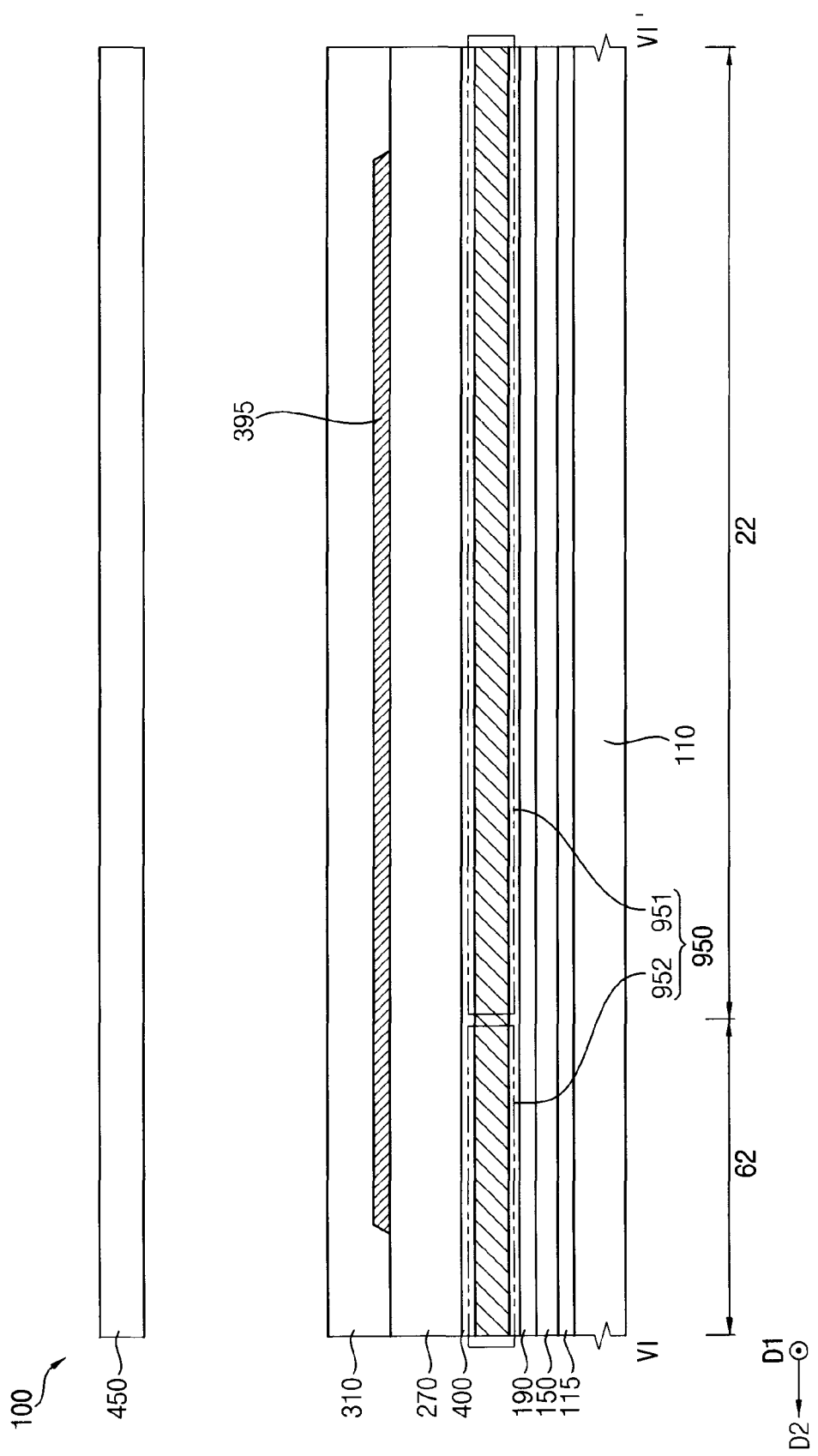
FIG. 12 is a cross-sectional view taken along line VI-VI' of FIG. 9.

FIG. 9 is a partially enlarged plan view showing a region B of FIG. 1; FIG. 10 is a cross-sectional view taken along line IV-IV' of FIG. 9; FIG. 11 is a cross-sectional view taken along line V-V' of FIG. 9; and FIG. 12 is a cross-sectional view taken along line VI-VI' of FIG. 9.

Referring to FIGS. 9, 10, 11, and 12, the display device 100 may further include a fan-out line 420, a first lower power line 840, a second lower power line 950, lower inspection pads 760, a fifth connection pattern 385, a sixth connection pattern 845, a seventh connection pattern 665, a sub-pixel structure 200, a lower connection member 395, a second electrode pattern 315, and the like.

Although the sub-pixel structure 200 of FIG. 10 has been assumed as having the same reference numeral as the sub-pixel structure 200 of FIG. 6 for convenience of description, the sub-pixel structure 200 of FIG. 10 and the sub-pixel structure 200 of FIG. 6 may be mutually different sub-pixel structures. In other words, the sub-pixel structure 200 of FIG. 10 may be a sub-pixel structure disposed in the display area 10 that is adjacent to the second peripheral area 22, and the sub-pixel structure 200 of FIG. 6 may be a sub-pixel structure disposed in the display area 10 that is adjacent to the first peripheral area 21. However, the light emitting layer 330 and the upper electrode 340 shown in FIG. 10 may be the same as the light emitting layer 330 and the upper electrode 340 shown in FIG. 6, respectively.

The fan-out line 420 may be disposed in the second pad area 62 and the second peripheral area 22 on the gate insulating layer 150. In the embodiments, the fan-out line 420 may be located between the substrate 110 and the first and second lower power lines 840 and 940. One side of the fan-out line 420 may be electrically connected to the driving circuit board 900 through the second pad electrodes 472 of FIG. 2, and an opposite side of the fan-out line 420 may be electrically connected to the lower inspection pads 760. The data signal DATA of FIG. 4 may be provided to the fan-out line 420 from the driving circuit board 900. The data signal DATA may be provided to the second transistor TR2 of FIG. 4 through the lower inspection pads 760 and the signal line 610. The fan-out line 420 may include a metal, an alloy, metal nitride, conductive metal oxide, a transparent conductive material, and the like. These may be used alone or in combination with each other. In some embodiments, the fan-out line 420 may have a multilayer structure including a plurality of metal layers formed of mutually different materials, and the metal layers may have mutually different thicknesses. In the embodiments, the fan-out line 420 may be located on the same layer as the gate electrode 170 and the second upper power line 740.

The first lower power line 840 may be disposed in the second pad area 62 on the interlayer insulating layer 190. In the embodiments, the first lower power line 840 may be located at a higher level than the fan-out line 420, and may be electrically connected to the first power circuit board 841 disposed in the second pad area 62 of FIG. 2. In other words, one side of the first lower power line 840 may extend in the second direction D2 so as to be electrically connected to the first power circuit board 841 through the second pad electrodes 472, and an opposite side of the first lower power line 840 may be electrically connected to the lower connection member 395. In this case, a fifth contact hole 842 may be located on the opposite side of the first lower power line 840 so that the opposite side of the first lower power line 840 may be electrically connected to the lower connection member 395, and the fifth contact hole 842 may expose a portion of a top surface of the first lower power line 840.

The first power (e.g., the low power voltage ELVSS of FIG. 4) may be provided to the first lower power line 840. The first power may be provided to the upper electrode 340 through the first lower power line 840, the lower connection member 395, and the first sub-power line 650. The first lower power line 840 may include a metal, an alloy, metal nitride, conductive metal oxide, a transparent conductive material, and the like. These may be used alone or in combination with each other. In some embodiments, the first lower power line 840 may have a multilayer structure including a plurality of metal layers formed of mutually different materials, and the metal layers may have mutually different thicknesses.

The second lower power line 950 may be disposed in the second pad area 62 on the interlayer insulating layer 190. In the embodiments, the second lower power line 950 may be located at a higher level than the fan-out line 420, and may be located on the same layer as the first lower power line 840. In addition, the second lower power line 950 may be electrically connected to the second power circuit board 941 disposed in the second pad area 62 of FIG. 2 through the second pad electrodes 472. Moreover, the second lower power line 950 may include a first line extension part 951 and a second line extension part 952. For example, the first line extension part 951 may be located in the second peripheral area 22, and may extend in the first direction D1. In other words, the first line extension part 951 may overlap the second peripheral area 22. The second line extension part 952 may extend from one side of the first line extension part 951 in the second direction D2 so as to be located in the second pad area 62. In other words, the second line extension part 952 may protrude from first and second portions of the first line extension part 951 in the second direction D2, and may extend in the second direction D2 so as to be electrically connected to the second power circuit board 941 through the second pad electrodes 472.

The second power (e.g., the high power voltage ELVDD of FIG. 4) may be provided to the second lower power line 950. The second power may be provided to the lower electrode 290 through the second lower power line 950 and the second sub-power line 750. The second lower power line 950 may include a metal, an alloy, metal nitride, conductive metal oxide, a transparent conductive material, and the like. These may be used alone or in combination with each other. In some embodiments, the second lower power line 950 may have a multilayer structure including a plurality of metal layers formed of mutually different materials, and the metal layers may have mutually different thicknesses.

The lower inspection pads 760 may be disposed in the second peripheral area 22 on the interlayer insulating layer 190 while being spaced apart from the second lower power line 950. For example, the second lower power line 950 may be located close to the second pad area 62 in the second peripheral area 22, and the lower inspection pads 760 may be located close to the display area 10 of the second peripheral area 22. The lower inspection pads 760 may be located on the same layer as the first lower power line 840 and the second lower power line 950, and may be arranged in the first direction D1 in the second peripheral area 22. Each of the lower inspection pads 760 may further include an extension part extending in the third direction D3, and the extension part may correspond to the signal line 610. In the embodiments, the interlayer insulating layer 190 may cover the fan-out line 420, and may have a contact hole 761 that exposes a portion of the fan-out line 420 in the second peripheral area 22. Each of the lower inspection pads 760 may be electrically connected to the fan-out line 420 through the contact hole 761. For example, the lower inspection pads 760 may function as OS pads configured to inspect an open state and a short of the data line (e.g., the signal line 610). Each of the lower inspection pads 760 may include a metal, an alloy, metal nitride, conductive metal oxide, a transparent conductive material, and the like. These may be used alone or in combination with each other. In other embodiments, each of the lower inspection pads 760 may have a multilayer structure including a plurality of metal layers formed of mutually different materials, and the metal layers may have mutually different thicknesses.

In the embodiments, the protective insulating layer 400 may include: a contact hole that exposes a first portion of a top surface of the first sub-power line 650; a contact hole that exposes a portion of a top surface of the first lower power line 840; a contact hole that exposes a second portion of the top surface of the first sub-power line 650; and the like.

The fifth connection pattern 385 may be disposed in the contact hole that exposes the first portion of the top surface of the first sub-power line 650, the sixth connection pattern 845 may be disposed in the contact hole that exposes the portion of the top surface of the first lower power line 840, and the seventh connection pattern 665 may be disposed in the contact hole that exposes the second portion of the top surface of the first sub-power line 650. In other words, at least a portion of each of the fifth to seventh connection patterns 385, 845, and 665 may be interposed between the protective insulating layer 400 and the planarization layer 270. The fifth connection pattern 385 may completely cover the first portion of the first sub-power line 650 exposed by the contact hole, the sixth connection pattern 845 may completely cover the first lower power line 840 exposed by the contact hole, and the seventh connection pattern 665 may completely cover the second portion of the first sub-power line 650 exposed by the contact hole. For example, in the method of manufacturing the display device 100, the first sub-power line 650 and the first lower power line 840 may be formed by using copper, and each of the fifth to seventh connection patterns 385, 845, and 665 may be formed by using indium tin oxide. After the planarization layer 270 is formed on the protective insulating layer 400, an etching process for forming contact holes of the planarization layer 270 overlapping the contact holes formed in the protective insulating layer 400 may be performed. The fifth to seventh connection patterns 385, 845, and 665 may be provided to protect the first sub-power line 650 and the first lower power line 840 while the etching process is performed. In some embodiments, each of the fifth to seventh connection patterns 385, 845, and 665 may include a metal, an alloy, metal nitride, conductive metal oxide, a transparent conductive material, and the like. These may be used alone or in combination with each other. In other embodiments, each of the fifth to seventh connection patterns 385, 845, and 665 may have a multilayer structure including a plurality of metal layers formed of mutually different materials, and the metal layers may have mutually different thicknesses.

In the embodiments, the planarization layer 270 may have a contact hole overlapping the contact hole of the protective insulating layer 400 that exposes the first portion of the top surface of the first sub-power line 650, and the contact holes may be defined as a fourth contact hole 391. In addition, the planarization layer 270 may have a contact hole overlapping the contact hole of the protective insulating layer 400 that exposes the portion of the top surface of the first lower power line 840, and the contact holes may be defined as the fifth contact hole 842. Moreover, the planarization layer 270 may have a contact hole overlapping the contact hole of the protective insulating layer 400 that exposes the second portion of the top surface of the first sub-power line 650, and the contact holes may be defined as a sixth contact hole 652.

The lower connection member 395 may be disposed in the second peripheral area 22 and the second pad area 62 on the planarization layer 270. The lower connection member 395 may extend in the first direction D1 in the second peripheral area 22, and may overlap a portion of the first lower power line 840 and the first sub-power line 650. The lower connection member 395 may electrically connect the first sub-power line 650 and the first lower power line 840 through the fourth contact hole 391 and the fifth contact hole 842. In other words, the first power applied to the first lower power line 840 may be provided to the first sub-power line 650 through the lower connection member 395. In some embodiments, a conductive member such as the conductive member 360 of FIG. 5 may be formed in the second peripheral area 22. For example, the conductive member may overlap one side of the lower connection member 395 that is adjacent to a boundary between the second peripheral area 22 and the display area 10, and may be disposed on the same layer as the gate electrode 170. The lower connection member 395 may include a metal, an alloy, metal nitride, conductive metal oxide, a transparent conductive material, and the like. These may be used alone or in combination with each other. In some embodiments, the lower connection member 395 may have a multilayer structure including a plurality of metal layers formed of mutually different materials, and the metal layers may have mutually different thicknesses.

The second electrode pattern 315 may be disposed in the sixth contact hole 652. The second electrode pattern 315 may be disposed between the upper electrode 340 and the seventh connection pattern 665, and may completely cover the seventh connection pattern 665 exposed by the sixth contact hole 652. For example, in the method of manufacturing the display device 100, after the light emitting layer 330 is formed, a laser drilling process for remove the light emitting layer 330, which is formed on the second electrode pattern 315 to overlap the sixth contact hole 652, may be performed. The light emitting layer 330 formed on the second electrode pattern 315 may be removed through the laser drilling process. While the laser drilling process is performed, the second electrode pattern 315 may protect the seventh connection pattern 665. The second electrode pattern 315 may include a metal, an alloy, metal nitride, conductive metal oxide, a transparent conductive material, and the like. These may be used alone or in combination with each other. In other embodiments, the second electrode pattern 315 may have a multilayer structure including a plurality of metal layers formed of mutually different materials, and the metal layers may have mutually different thicknesses.

As described above, the display device 100 shown in FIGS. 1 to 12 may be provided.

Since the display device 100 according to the embodiments of the present invention includes the conductive member 360, and the first contact hole 361 formed on the conductive member 360 has a relatively wide area, the heat generation phenomenon that may occur in the first peripheral area 21 may be reduced. In addition, since the display device 100 includes the third contact hole 651, and the upper electrode 340 receives the first power from the first sub-power line 650 in each of the sub-pixel areas 30, the voltage drop phenomenon that may occur in the display area 10 may be reduced. Accordingly, according to the display device 100, both the heat generation phenomenon that may occur in the first peripheral area 21 and the voltage drop phenomenon that may occur in the display area 10 may be reduced.

However, although the display device 100 according to the present invention has been described as specifically being an organic light emitting diode display device, the inventive concepts are not limited thereto. In other embodiments, the display device 100 may include a liquid crystal display device (LCD), a field emission display device (FED), a plasma display device (PDP), or an electrophoretic image display device (EPD).

FIGS. 13 to 26 are views showing a method of manufacturing a display device according to embodiments of the present invention. For example, FIGS. 13, 14, 18, and 19 are plan views showing the method of manufacturing the display device, and FIGS. 15 to 17 and 20 to 26 are sectional views showing the method of manufacturing the display device.

Figure 13:
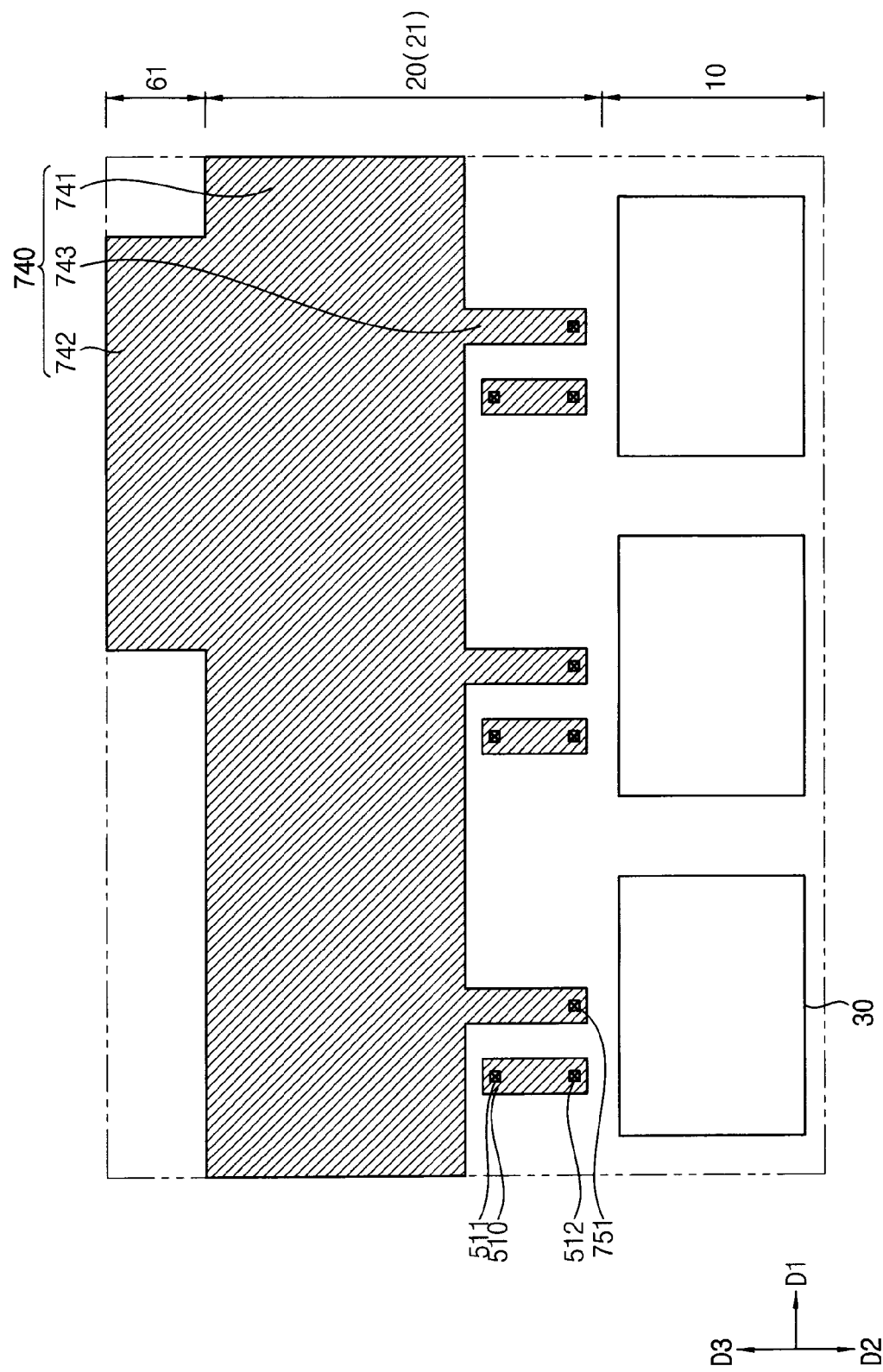
FIGS. 13, 14, 15, 16, 17, 18, 19, 20, 21, 22, 23, 24, 25, and 26 are views showing a method of manufacturing a display device according to embodiments of the present invention.
Figure 14:
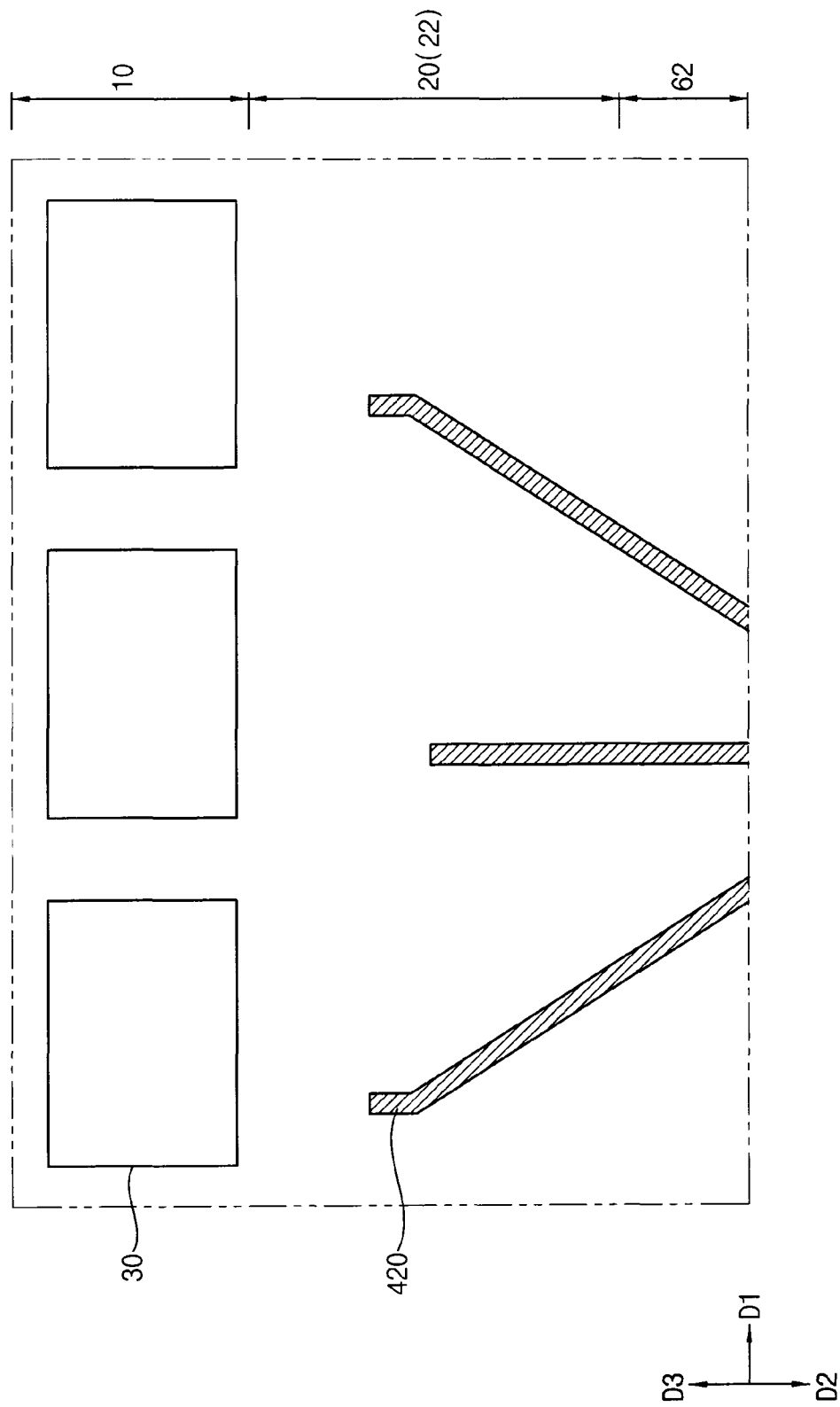
Figure 15:
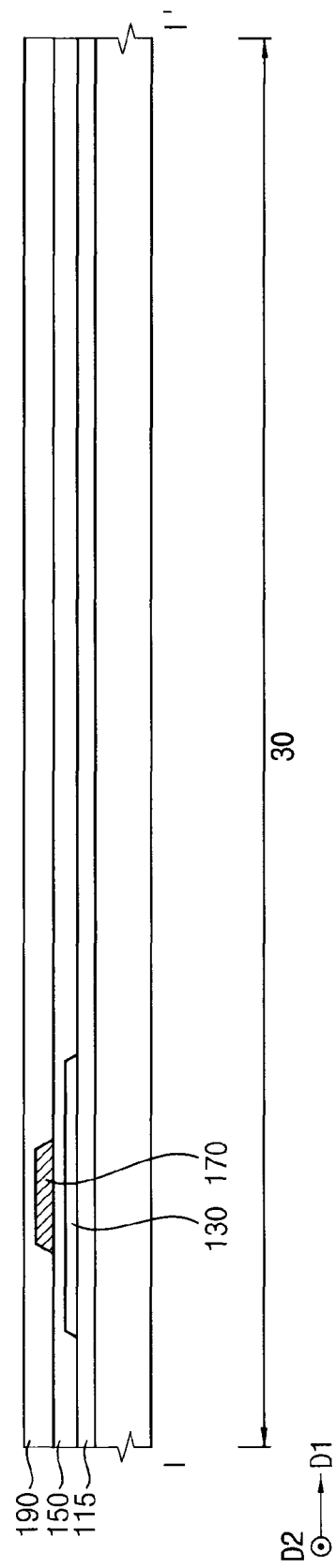
Figure 16:
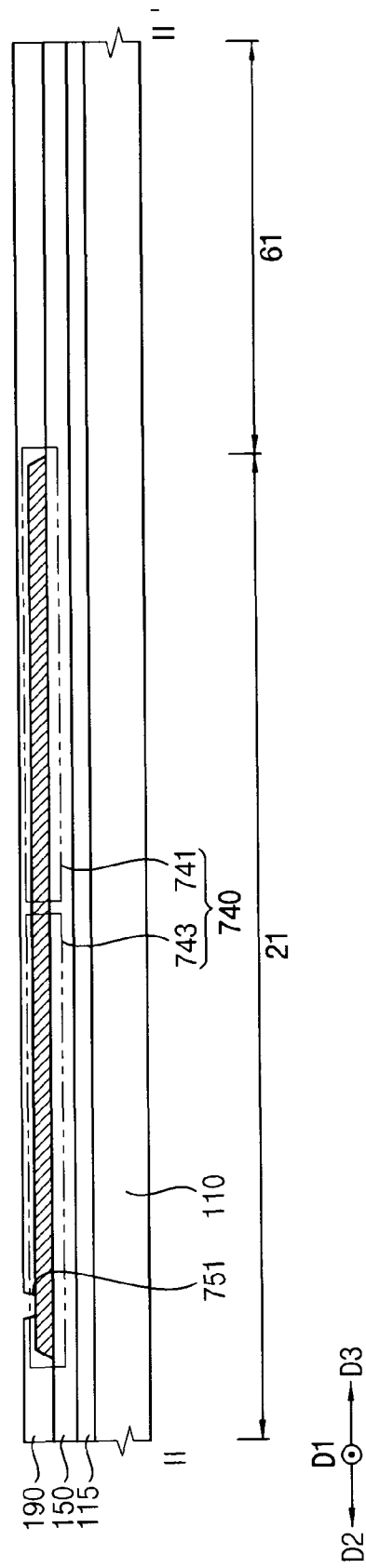
Figure 17:
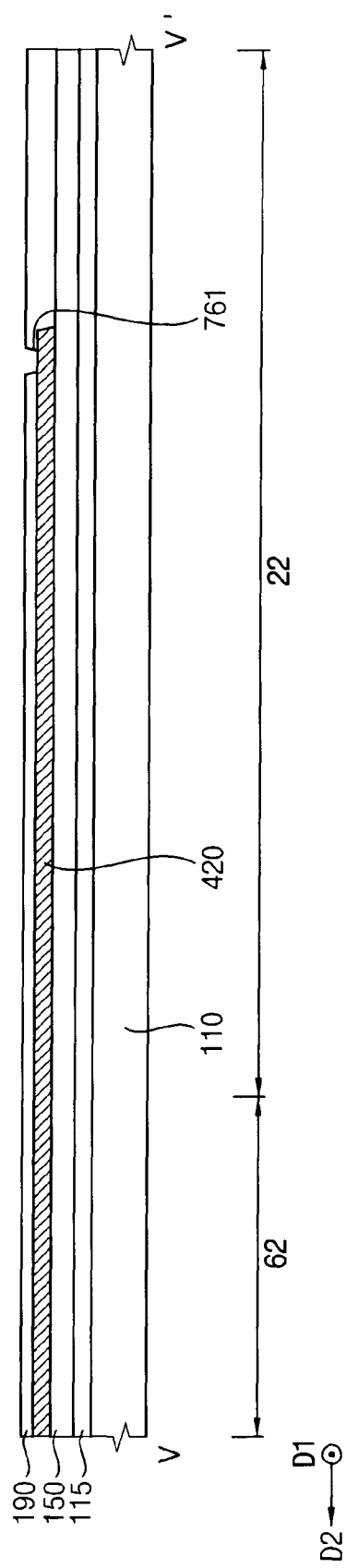

Referring to FIGS. 13, 14, 15, 16, and 17, as shown in FIGS. 15, 16, and 17, a substrate 110 including transparent or opaque materials may be provided. The substrate 110 may be formed by using a quartz substrate, a synthetic quartz substrate, a calcium fluoride substrate, a fluorine-doped quartz substrate, a soda lime glass substrate, a non-alkali glass substrate, and the like. The substrate 110 may include a display area 10 in which a plurality of sub-pixel areas 30 are arranged, a peripheral area 20 including a first peripheral area 21 and a second peripheral area 22, a first pad area 61, and a second pad area 62 (see FIG. 1).

As shown in FIGS. 15, 16, and 17, a buffer layer 115 may be formed on the substrate 110. The buffer layer 115 may be formed over the whole of the display area 10, the peripheral area 20, the first pad area 61, and the second pad area 62 on the substrate 110. Depending on a type of the substrate 110, at least two buffer layers 115 may be provided on the substrate 110, or the buffer layer 115 may not be formed. The buffer layer 115 may be formed by using a silicon compound, metal oxide, and the like. The buffer layer 115 may include silicon oxide, silicon nitride, silicon oxynitride, silicon oxycarbide, silicon carbonitride, aluminum oxide, aluminum nitride, tantalum oxide, hafnium oxide, zirconium oxide, titanium oxide, and the like.

As shown in FIG. 15, an active layer 130 may be formed in the sub-pixel area 30 on the buffer layer 115. The active layer 130 may be formed by using a metal oxide semiconductor, an inorganic semiconductor, an organic semiconductor, or the like. The active layer 130 may include a source region, a drain region, and a channel region located between the source region and the drain region.

As shown in FIGS. 15, 16, and 17, a gate insulating layer 150 may be formed on the active layer 130. The gate insulating layer 150 may be formed in the display area 10, the peripheral area 20, the first pad area 61, and the second pad area 62 on the buffer layer 115. The gate insulating layer 150 may cover the active layer 130 in the sub-pixel area 30 on the buffer layer 115, and may extend in a direction from the sub-pixel area 30 to the peripheral area 20. For example, the gate insulating layer 150 may sufficiently cover the active layer 130 on the buffer layer 115, and may have a substantially flat top surface without creating a step around the active layer 130. In some embodiments, the gate insulating layer 150 may be formed along a profile of the active layer 130 with a uniform thickness to cover the active layer 130 on the buffer layer 115. The gate insulating layer 150 may be formed by using a silicon compound, metal oxide, and the like.

As shown in FIG. 15, a gate electrode 170 may be formed in the sub-pixel area 30 on the gate insulating layer 150. The gate electrode 170 may be formed on a portion of the gate insulating layer 150 under which the active layer 130 is located. The gate electrode 170 may be formed by using a metal, an alloy, metal nitride, conductive metal oxide, a transparent conductive material, and the like. These may be used alone or in combination with each other.

As shown in FIGS. 13 and 16, a second upper power line 740 may be formed in the first pad area 61 and the first peripheral area 21 on the gate insulating layer 150. The second upper power line 740 may include a first line extension part 741, a second line extension part 742, and a third line extension part 743. For example, the first line extension part 741 may be located in the first peripheral area 21, and may extend in the first direction D1. The second line extension part 742 may extend from one side of the first line extension part 741 in the third direction D3 so as to be located in the first pad area 61. The third line extension part 743 may extend from an opposite side of the first line extension part 741 in the second direction D2. The first line extension part 741, the second line extension part 742, and the third line extension part 743 may be formed integrally with each other. The second upper power line 740 may be formed by using a metal, an alloy, metal nitride, conductive metal oxide, a transparent conductive material, and the like. These may be used alone or in combination with each other.

As shown in FIGS. 14 and 17, a fan-out line 420 may be formed in the second pad area 62 and the second peripheral area 22 on the gate insulating layer 150. The fan-out line 420 may be formed by using a metal, an alloy, metal nitride, conductive metal oxide, a transparent conductive material, and the like. These may be used alone or in combination with each other.

As shown in FIG. 13, a conductive pattern 510 may be formed in parallel with the third line extension part 743 in the first peripheral area 21 on the gate insulating layer 150. The conductive pattern 510 may be formed by using a metal, an alloy, metal nitride, conductive metal oxide, a transparent conductive material, and the like. These may be used alone or in combination with each other.

In embodiments, the gate electrode 170, the conductive pattern 510, the second upper power line 740, and the fan-out line 420 may be simultaneously formed by using the same material.

As shown in FIGS. 13, 15, 16, and 17, an interlayer insulating layer 190 may be formed on the gate electrode 170, the conductive pattern 510, the second upper power line 740, and the fan-out line 420. The interlayer insulating layer 190 may be formed in the display area 10, the peripheral area 20, the first pad area 61, and the second pad area 62 on the gate insulating layer 150. The interlayer insulating layer 190 may include: a contact hole 511 that exposes one side of the conductive pattern 510 in the first peripheral area 21; a contact hole 512 that exposes an opposite side of the conductive pattern 510; and a contact hole 751 that exposes a portion of the third line extension part 743 that is adjacent to the display area 10, and may include a contact hole 761 that exposes a portion of the fan-out line 420 in the second peripheral area 22. For example, the interlayer insulating layer 190 may sufficiently cover the gate electrode 170, the conductive pattern 510, the second upper power line 740, and the fan-out line 420 on the gate insulating layer 150, and may have a substantially flat top surface without creating a step around the gate electrode 170, the conductive pattern 510, the second upper power line 740, and the fan-out line 420. In some embodiments, the interlayer insulating layer 190 may be formed along a profile of the gate electrode 170, the conductive pattern 510, the second upper power line 740, and the fan-out line 420 with a uniform thickness to cover the gate electrode 170, the conductive pattern 510, the second upper power line 740, and the fan-out line 420 on the gate insulating layer 150. The interlayer insulating layer 190 may be formed by using a silicon compound, metal oxide, and the like.

Figure 18:
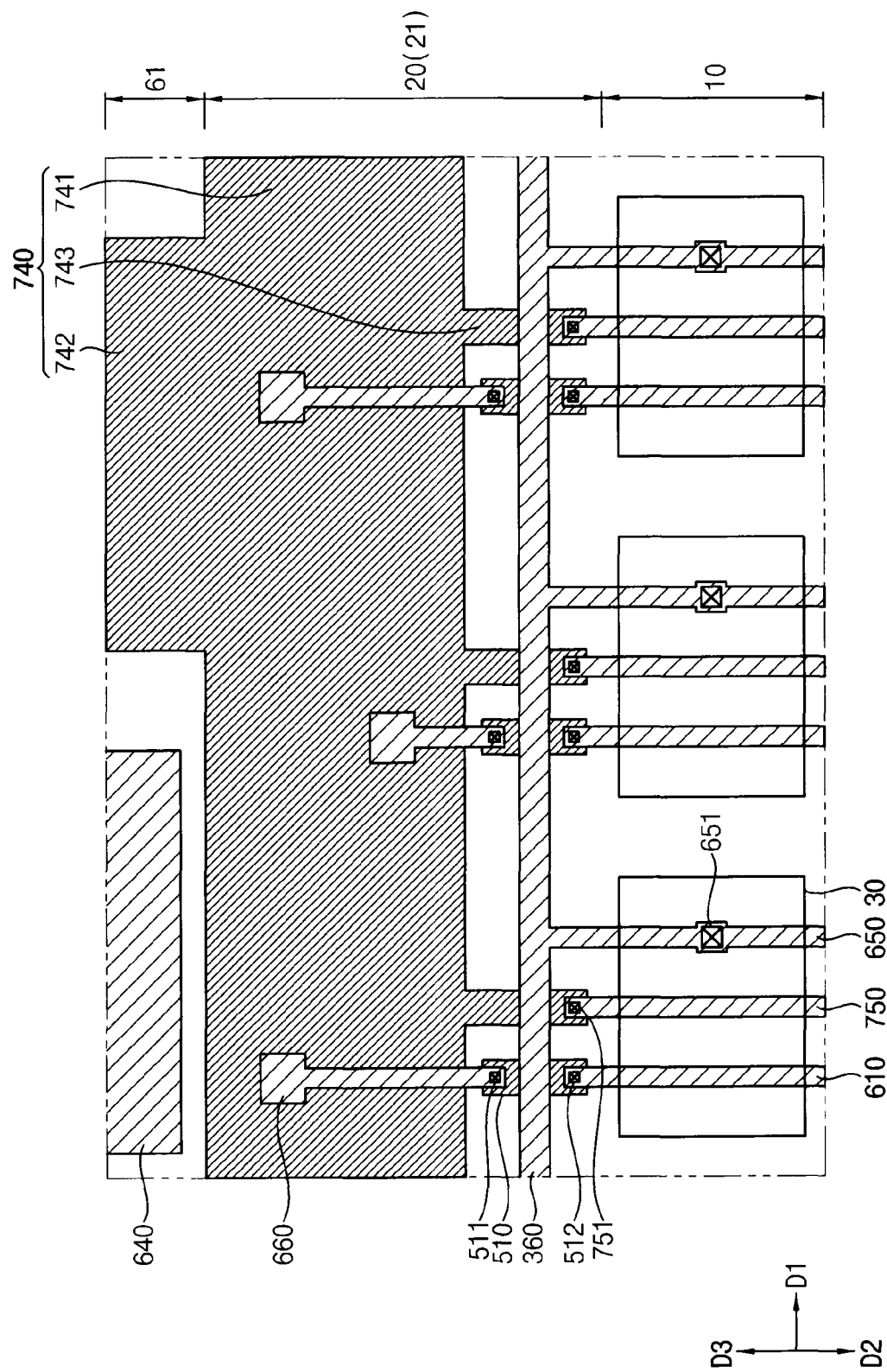
Figure 19:
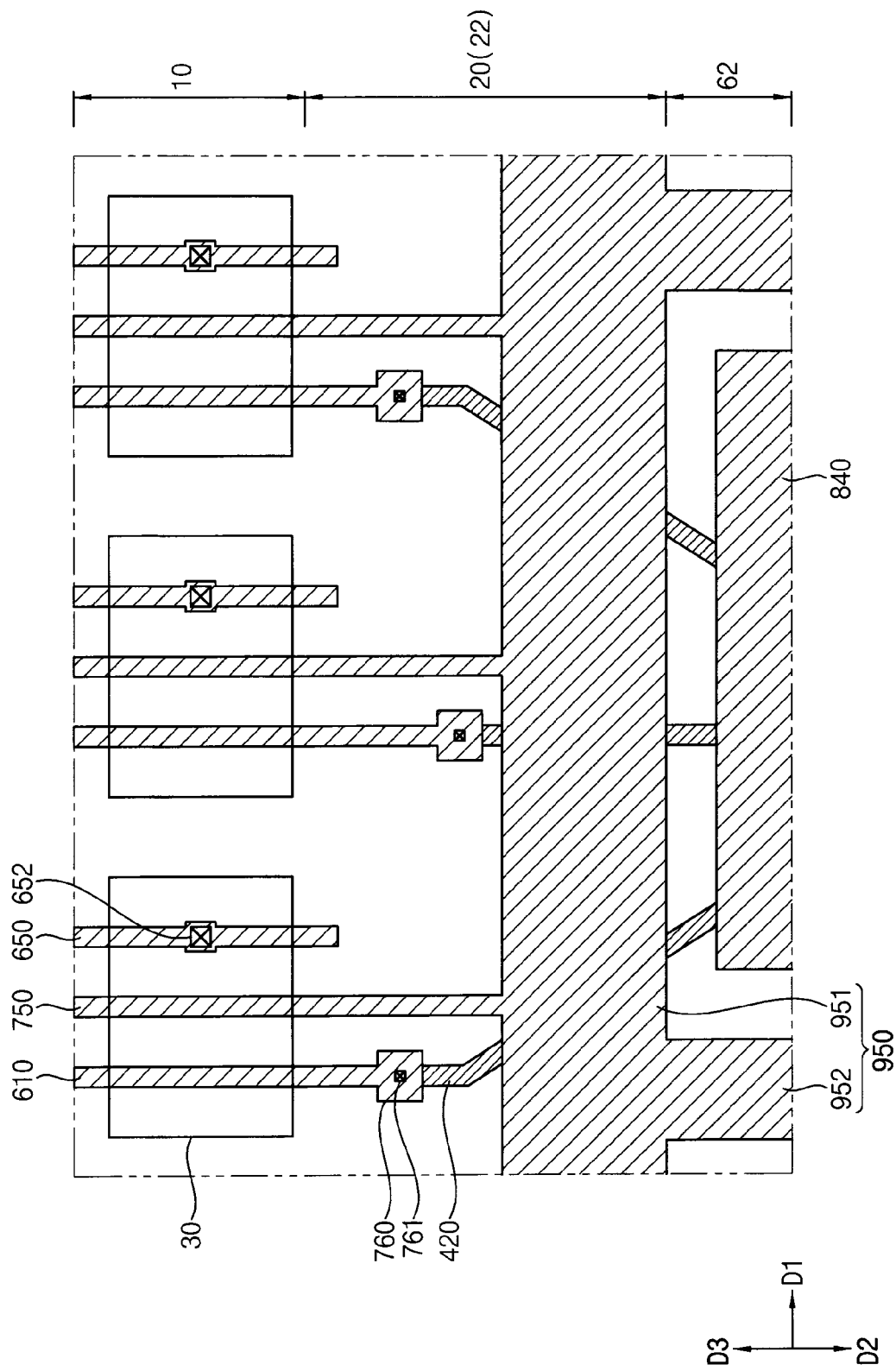
Figure 20:
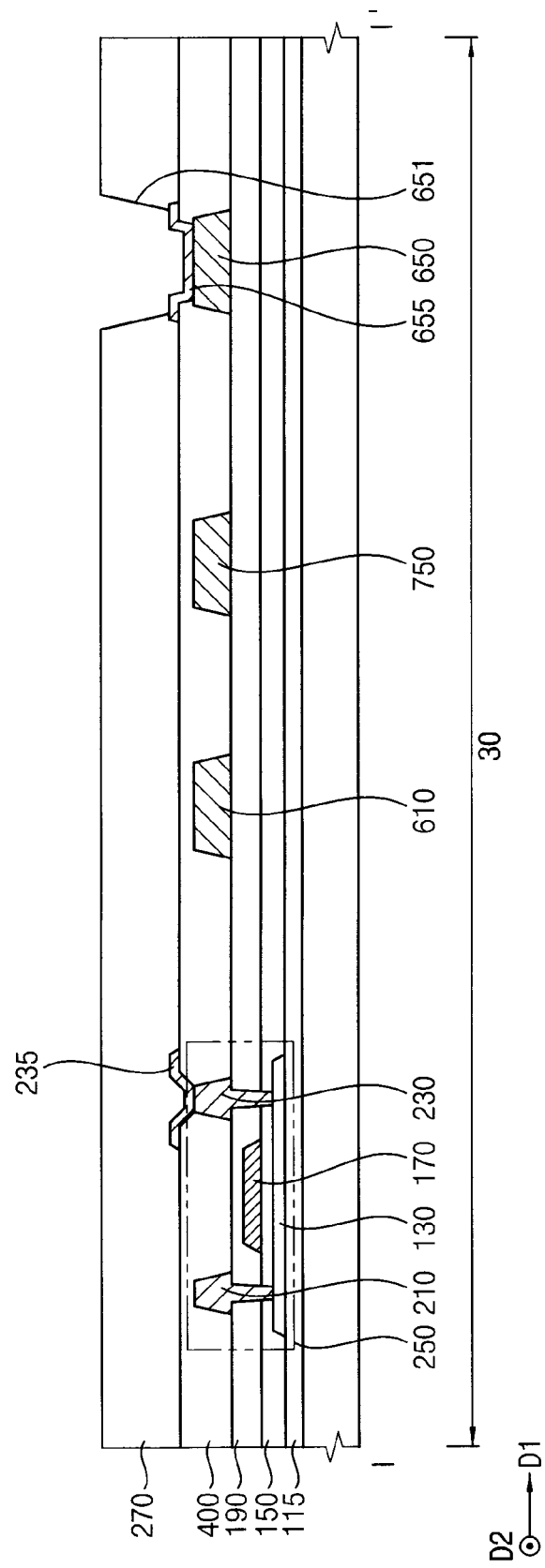

Referring to FIGS. 18, 19, 20, 21, and 22, as shown in FIG. 20, a source electrode 210 and a drain electrode 230 may be formed in the sub-pixel area 30 on the interlayer insulating layer 190. The source electrode 210 may be connected to the source region of the active layer 130 through a contact hole formed by removing first portions of the gate insulating layer 150 and the interlayer insulating layer 190, and the drain electrode 230 may be connected to the drain region of the active layer 130 through a contact hole formed by removing second portions of the gate insulating layer 150 and the interlayer insulating layer 190. Each of the source electrode 210 and the drain electrode 230 may be formed by using a metal, an alloy, metal nitride, conductive metal oxide, a transparent conductive material, and the like. These may be used alone or in combination with each other.

Accordingly, the semiconductor element 250 including the active layer 130, the gate insulating layer 150, the gate electrode 170, the interlayer insulating layer 190, the source electrode 210, and the drain electrode 230 may be formed.

Figure 21:
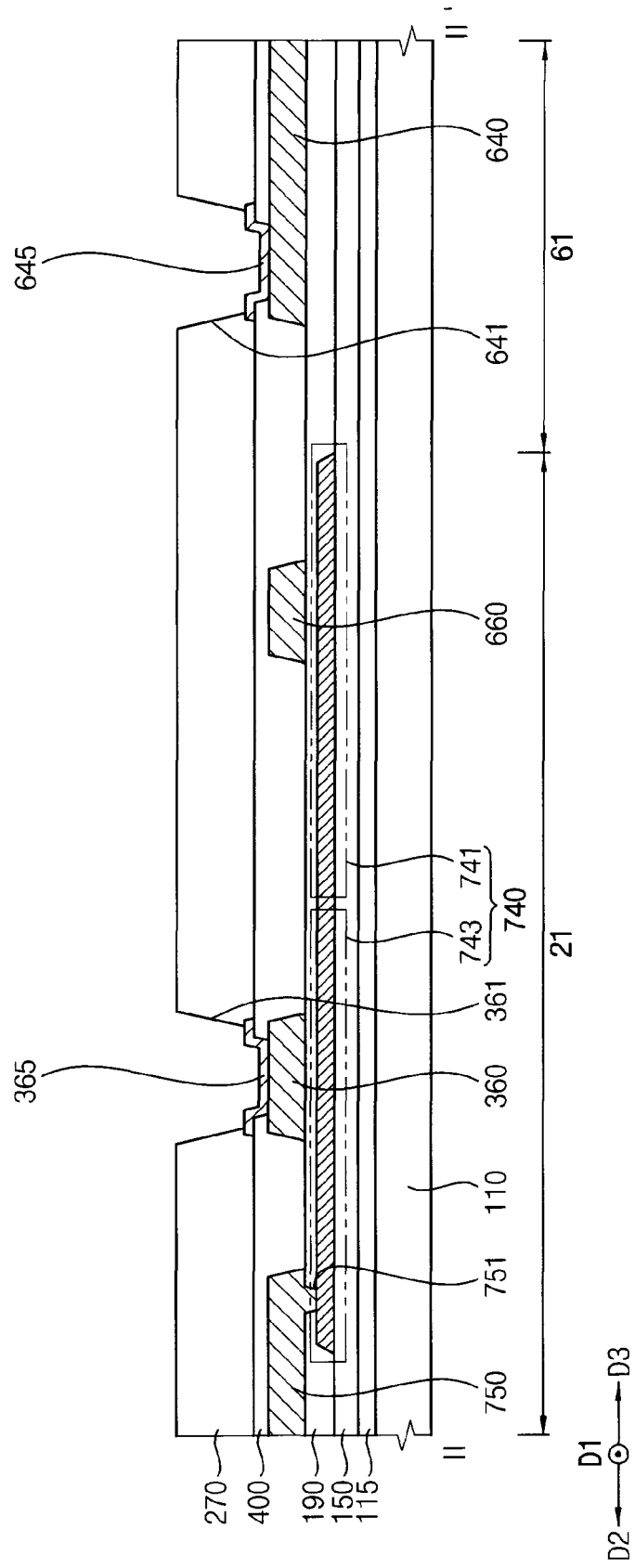

As shown in FIGS. 18 and 21, a conductive member 360 may be formed in the first peripheral area 21 and the display area 10 on the interlayer insulating layer 190. For example, the conductive member 360 may include a first extension part and a second extension part. In this case, the first extension part may extend in the first direction D1 in the first peripheral area 21, and may be located in parallel with the first line extension part 741. In addition, the second extension part may be formed in the sub-pixel area 30. The second extension part may be defined as a first sub-power line 650. The first extension part and the second extension part may be formed integrally with each other. The conductive member 360 may be formed by using a metal, an alloy, metal nitride, conductive metal oxide, a transparent conductive material, and the like. For example, the conductive member 360 may include gold, silver, aluminum, platinum, nickel, titanium, palladium, magnesium, calcium, lithium, chromium, tantalum, tungsten, copper, molybdenum, scandium, neodymium, iridium, an aluminum-containing alloy, aluminum nitride, a silver-containing alloy, tungsten nitride, a copper-containing alloy, a molybdenum-containing alloy, titanium nitride, chromium nitride, tantalum nitride, strontium ruthenium oxide, zinc oxide, indium tin oxide, tin oxide, indium oxide, gallium oxide, indium zinc oxide, and the like. These may be used alone or in combination with each other.

As shown in FIGS. 18 and 21, a first upper power line 640 may be formed in the first pad area 61 on the interlayer insulating layer 190. The first upper power line 640 may be formed in parallel with the second line extension part 742. The first upper power line 640 may be formed by using a metal, an alloy, metal nitride, conductive metal oxide, a transparent conductive material, and the like. These may be used alone or in combination with each other.

As shown in FIGS. 18, 20, and 21, a signal line 610 may be formed in a portion of the first peripheral area 21 and the display area 10 on the interlayer insulating layer 190, and may extend in the second direction D2. One side of the signal line 610 may overlap the contact hole 512 of the interlayer insulating layer 190, and may be connected to the conductive pattern 510 through the contact hole 512. The signal line 610 may be formed by using a metal, an alloy, metal nitride, conductive metal oxide, a transparent conductive material, and the like. These may be used alone or in combination with each other.

As shown in FIGS. 18 and 21, a second sub-power line 750 may be formed in parallel with the signal line 610 and the first sub-power line 650 in a portion of the first peripheral area 21 and the display area 10 on the interlayer insulating layer 190, and may extend in the second direction D2. The second sub-power line 750 may be connected to the second upper power line 740 through the contact hole 751 in the first peripheral area 21. The second sub-power line 750 may be formed by using a metal, an alloy, metal nitride, conductive metal oxide, a transparent conductive material, and the like. These may be used alone or in combination with each other.

As shown in FIGS. 18 and 21, upper inspection pads 660 may be formed in the first peripheral area 21 on the interlayer insulating layer 190 to overlap the first line extension part 741 of the second upper power line 740. The upper inspection pads 660 may be arranged in the first direction D1 in the first peripheral area 21. Each of the upper inspection pads 660 may further include an extension part extending in the second direction D2, in which one side of the extension part may be connected to the upper inspection pad 660, and an opposite side of the extension part may overlap the contact hole 511 of the interlayer insulating layer 190, and may be connected to the conductive pattern 510 through the contact hole 511. Each of the upper inspection pads 660 may be formed by using a metal, an alloy, metal nitride, conductive metal oxide, a transparent conductive material, and the like. These may be used alone or in combination with each other.

Figure 22:
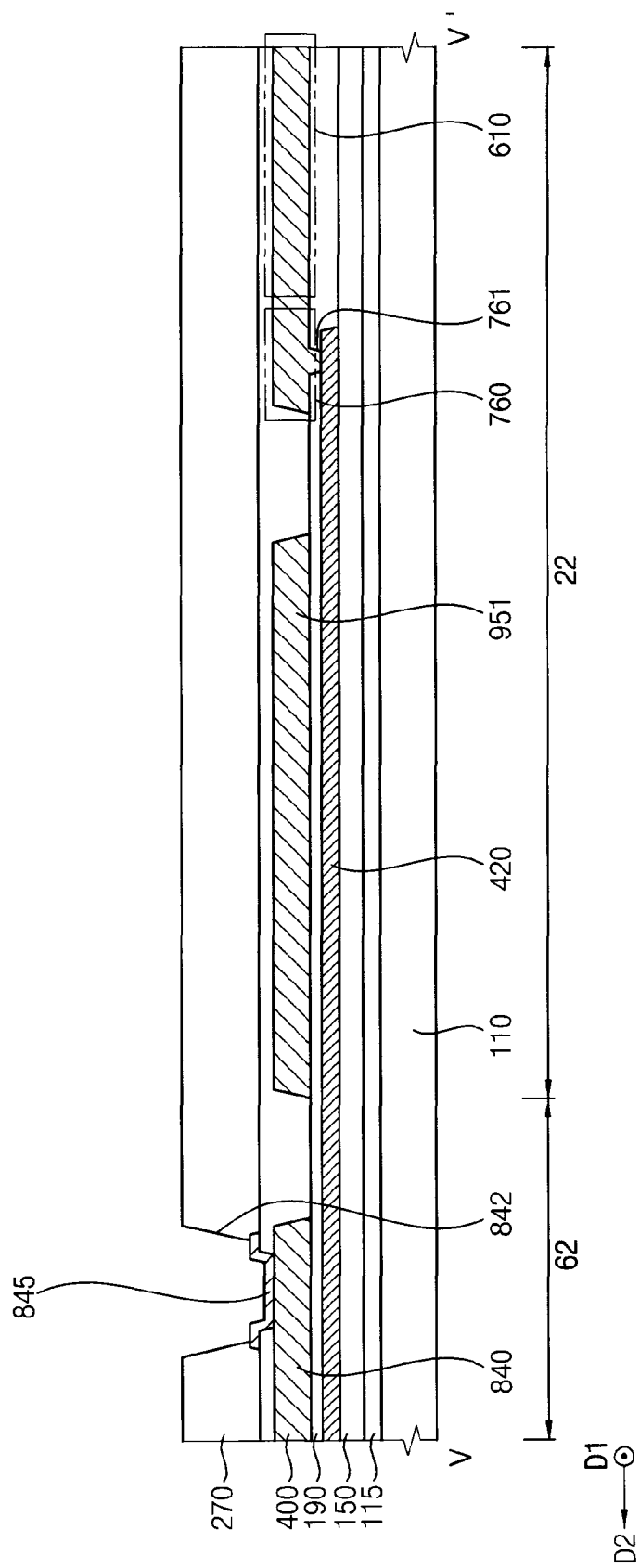

As shown in FIGS. 19 and 22, a first lower power line 840 may be formed in the second pad area 62 on the interlayer insulating layer 190. The first lower power line 840 may be formed by using a metal, an alloy, metal nitride, conductive metal oxide, a transparent conductive material, and the like. These may be used alone or in combination with each other.

As shown in FIGS. 19 and 22, a second lower power line 950 may be formed in the second pad area 62 on the interlayer insulating layer 190. The second lower power line 950 may include a first line extension part 951 and a second line extension part 952. For example, the first line extension part 951 may be located in the second peripheral area 22, and may extend in the first direction D1. The second line extension part 952 may extend from one side of the first line extension part 951 in the second direction D2 so as to be located in the second pad area 62. The second lower power line 950 may be formed by using a metal, an alloy, metal nitride, conductive metal oxide, a transparent conductive material, and the like. These may be used alone or in combination with each other.

As shown in FIGS. 19 and 22, lower inspection pads 760 may be formed in the second peripheral area 22 on the interlayer insulating layer 190 while being spaced apart from the second lower power line 950. For example, the second lower power line 950 may be formed close to the second pad area 62 in the second peripheral area 22, and the lower inspection pads 760 may be formed close to the display area 10 in the second peripheral area 22. The lower inspection pads 760 may be arranged in the first direction D1 in the second peripheral area 22. Each of the lower inspection pads 760 may further include an extension part extending in the third direction D3, and the extension part may correspond to the signal line 610. Each of the lower inspection pads 760 may be connected to the fan-out line 420 through the contact hole 761 of the interlayer insulating layer 190. Each of the lower inspection pads 760 may be formed by using a metal, an alloy, metal nitride, conductive metal oxide, a transparent conductive material, and the like. These may be used alone or in combination with each other.

In the embodiments, the source electrode 210, the drain electrode 230, the conductive member 360, the first upper power line 640, the signal line 610, the second sub-power line 750, the upper inspection pads 660, the first lower power line 840, the second lower power line 950, and the lower inspection pads 760 may be simultaneously formed by using the same material.

Referring to FIG. 1, first pad electrodes 471 may be formed in the first pad area 61 on the substrate 110, and second pad electrodes 472 may be formed in the second pad area 62 on the substrate 110. For example, the first pad electrodes 471 and the second pad electrodes 472 may be formed simultaneously with the source electrode 210, the drain electrode 230, the conductive member 360, the first upper power line 640, the signal line 610, the second sub-power line 750, the upper inspection pads 660, the first lower power line 840, the second lower power line 950, and the lower inspection pads 760 by using the same material as the source electrode 210, the drain electrode 230, the conductive member 360, the first upper power line 640, the signal line 610, the second sub-power line 750, the upper inspection pads 660, the first lower power line 840, the second lower power line 950, and the lower inspection pads 760.

As shown in FIGS. 18 to 22, a protective insulating layer 400 may be formed in the display area 10, the peripheral area 20, the first pad area 61, and the second pad area 62 on the source electrode 210, the drain electrode 230, the conductive member 360, the first upper power line 640, the signal line 610, the second sub-power line 750, the upper inspection pads 660, the first lower power line 840, the second lower power line 950, and the lower inspection pads 760. The protective insulating layer 400 may sufficiently cover the source electrode 210, the drain electrode 230, the conductive member 360, the first upper power line 640, the signal line 610, the second sub-power line 750, the upper inspection pads 660, the first lower power line 840, the second lower power line 950, and the lower inspection pads 760 on the interlayer insulating layer 190, and may have a substantially flat top surface without creating a step around the source electrode 210, the drain electrode 230, the conductive member 360, the first upper power line 640, the signal line 610, the second sub-power line 750, the upper inspection pads 660, the first lower power line 840, the second lower power line 950, and the lower inspection pads 760. In some embodiments, the protective insulating layer 400 may be formed along a profile of the source electrode 210, the drain electrode 230, the conductive member 360, the first upper power line 640, the signal line 610, the second sub-power line 750, the upper inspection pads 660, the first lower power line 840, the second lower power line 950, and the lower inspection pads 760 with a substantially uniform thickness to cover the source electrode 210, the drain electrode 230, the conductive member 360, the first upper power line 640, the signal line 610, the second sub-power line 750, the upper inspection pads 660, the first lower power line 840, the second lower power line 950, and the lower inspection pads 760 on the interlayer insulating layer 190. The protective insulating layer 400 may be formed by using a silicon compound, metal oxide, and the like.

After the protective insulating layer 400 is formed, a contact hole that exposes a portion of a top surface of the drain electrode 230, a contact hole that exposes a portion of a top surface of the first sub-power line 650, a contact hole that exposes a portion of a top surface of the conductive member 360, a contact hole that exposes a portion of a top surface of the first upper power line 640, a contact hole that exposes a first portion of the top surface of the first sub-power line 650, a contact hole that exposes a portion of a top surface of the first lower power line 840, and a contact hole that exposes a second portion of the top surface of the first sub-power line 650 may be formed in the protective insulating layer 400.

A first connection pattern 365 may be formed in the contact hole that exposes the portion of the top surface of the conductive member 360, a second connection pattern 645 may be formed in the contact hole that exposes the portion of the first upper power line 640, a third connection pattern 235 may be formed in the contact hole that exposes the portion of the top surface of the drain electrode 230, a fourth connection pattern 655 may be formed in the contact hole that exposes the portion of the top surface of the first sub-power line 650, a fifth connection pattern 385 may be formed in the contact hole that exposes the first portion of the top surface of the first sub-power line 650, a sixth connection pattern 845 may be formed in the contact hole that exposes the portion of the top surface of the first lower power line 840, and a seventh connection pattern 665 may be formed in the contact hole that exposes the second portion of the top surface of the first sub-power line 650. The first to seventh connection patterns 365, 645, 235, 655, 385, 845, and 665 may be formed to protect the conductive member 360, the second connection pattern 645, the first upper power line 640, the drain electrode 230, the first sub-power line 650, and the first lower power line 840. Each of the first to seventh connection patterns 365, 645, 235, 655, 385, 845, and 665 may be formed by using a metal, an alloy, metal nitride, conductive metal oxide, a transparent conductive material, and the like. These may be used alone or in combination with each other.

A planarization layer 270 may be formed on the first to seventh connection patterns 365, 645, 235, 655, 385, 845, and 665. The planarization layer 270 may be formed in the display area 10, the peripheral area 20, the first pad area 61, and the second pad area 62 on the protective insulating layer 400. For example, the planarization layer 270 may have a relatively large thickness. In this case, the planarization layer 270 may have a substantially flat top surface. In order to implement such a flat top surface of the planarization layer 270, a planarization process may be additionally performed on the planarization layer 270. In some embodiments, the planarization layer 270 may be formed along a profile of the first to seventh connection patterns 365, 645, 235, 655, 385, 845, and 665 with a uniform thickness on the protective insulating layer 400. The planarization layer 270 may be formed by using an organic material. For example, the planarization layer 270 may include a photoresist, a polyacryl-based resin, a polyimide-based resin, a polyamide-based resin, a siloxane-based resin, an acryl-based resin, an epoxy-based resin, and the like.

After the planarization layer 270 is formed, a contact hole overlapping the contact hole of the protective insulating layer 400 that exposes the portion of the top surface of the conductive member 360 may be formed in the planarization layer 270, and the contact holes may be defined as a first contact hole 361. A contact hole overlapping the contact hole of the protective insulating layer 400 that exposes the portion of the first upper power line 640 may be formed in the planarization layer 270, and the contact holes may be defined as a second contact hole 641. A contact hole overlapping the contact hole of the protective insulating layer 400 that exposes the portion of the top surface of the first sub-power line 650 may be formed in the planarization layer 270, and the contact holes may be defined as a third contact hole 651. A contact hole overlapping the contact hole of the protective insulating layer 400 that exposes the portion of the top surface of the drain electrode 230 may be formed in the planarization layer 270. A contact hole overlapping the contact hole of the protective insulating layer 400 that exposes the first portion of the top surface of the first sub-power line 650 may be formed in the planarization layer 270, and the contact holes may be defined as a fourth contact hole 391. A contact hole overlapping the contact hole of the protective insulating layer 400 that exposes the portion of the top surface of the first lower power line 840 may be formed in the planarization layer 270, and the contact holes may be defined as a fifth contact hole 842. A contact hole overlapping the contact hole of the protective insulating layer 400 that exposes the second portion of the top surface of the first sub-power line 650 may be formed in the planarization layer 270, and the contact holes may be defined as a sixth contact hole 652.

Figure 23:
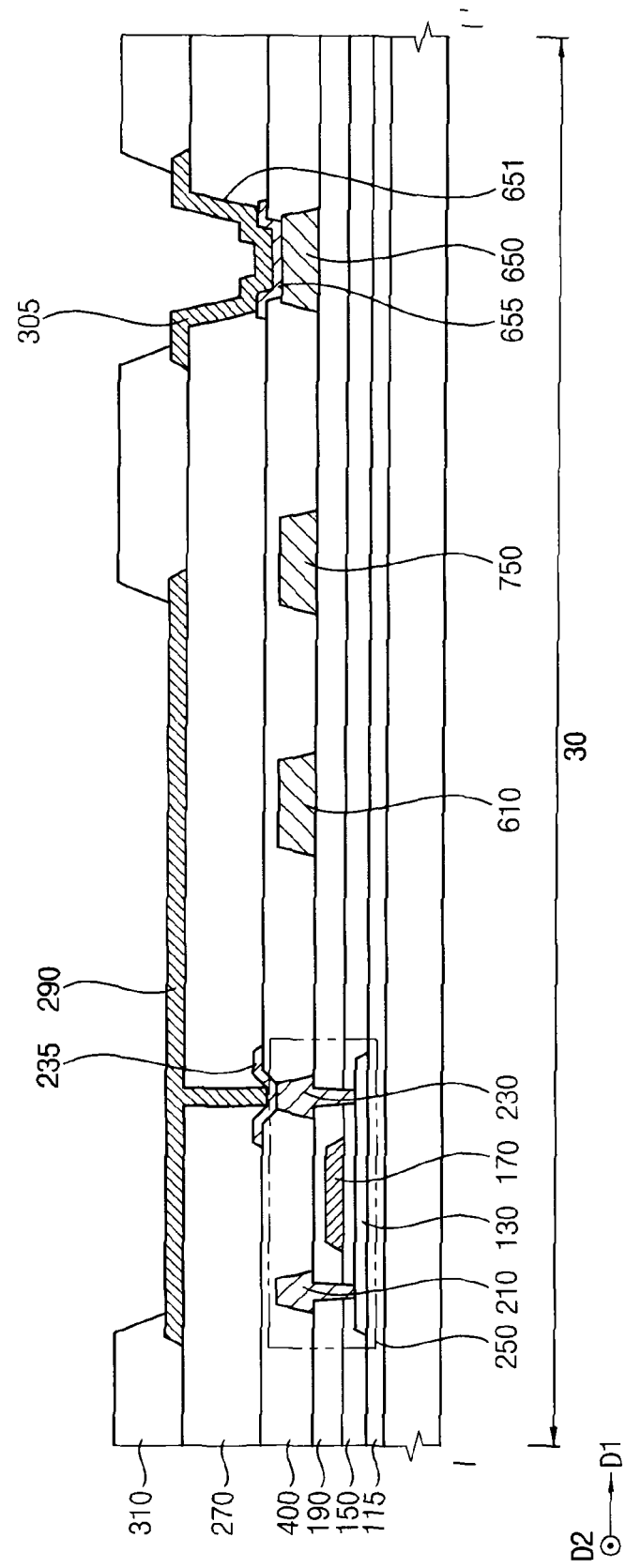

Referring to FIGS. 5, 9, 23, 24, and 25, as shown in FIG. 23, a lower electrode 290 may be formed in the sub-pixel area 30 on the planarization layer 270. The lower electrode 290 may be formed by using a metal, an alloy, metal nitride, conductive metal oxide, a transparent conductive material, and the like. These may be used alone or in combination with each other.

Figure 24:
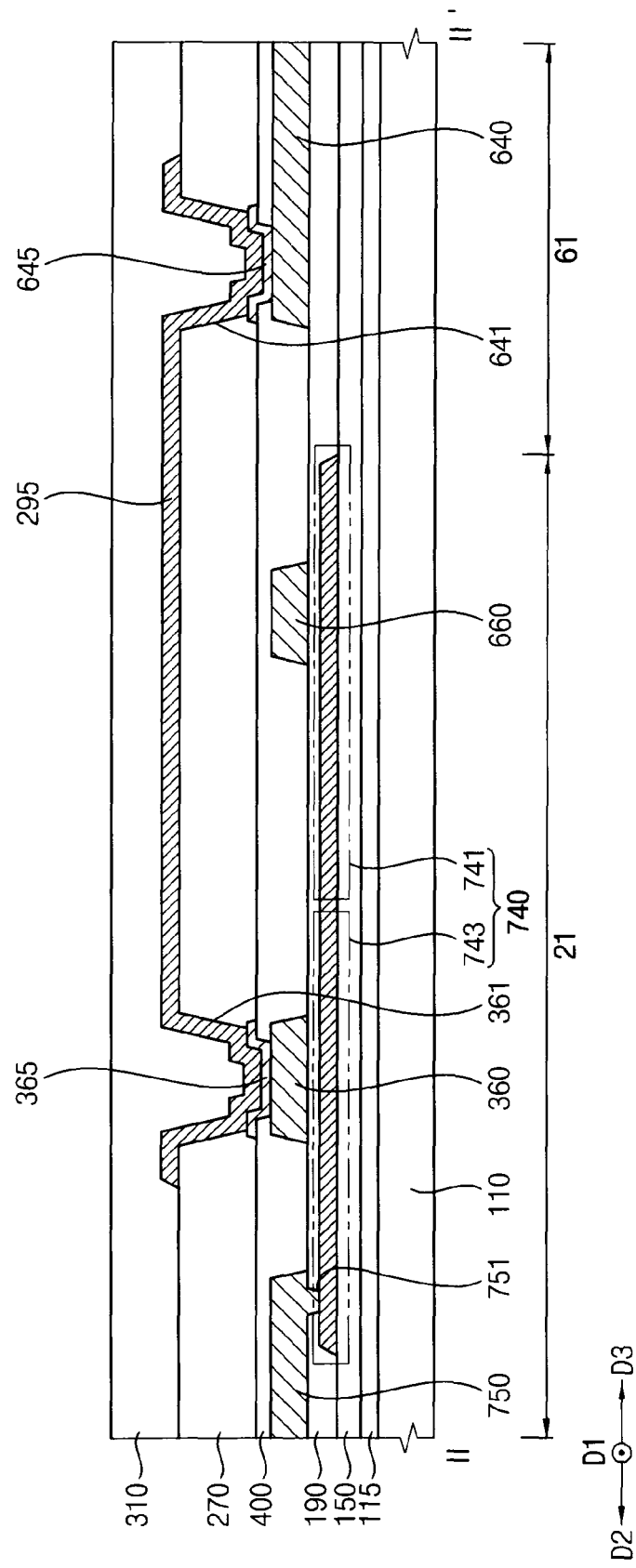

As shown in FIGS. 5 and 24, an upper connection member 295 may be formed in the first peripheral area 21 and the first pad area 61 on the planarization layer 270. The upper connection member 295 may extend in the first direction D1 in the first peripheral area 21, and may overlap a portion of the first upper power line 640 and the conductive member 360. The upper connection member 295 may be connected to the conductive member 360 and the first upper power line 640 through the first contact hole 361 and the second contact hole 641, respectively. The upper connection member 295 may be formed by using a metal, an alloy, metal nitride, conductive metal oxide, a transparent conductive material, and the like. These may be used alone or in combination with each other.

As shown in FIGS. 5 and 23, a first electrode pattern 305 may be formed in the third contact hole 651. The first electrode pattern 305 may completely cover the fourth connection pattern 655 exposed by the third contact hole 651. The first electrode pattern 305 may be formed by using a metal, an alloy, metal nitride, conductive metal oxide, a transparent conductive material, and the like. These may be used alone or in combination with each other.

As shown in FIGS. 9, 23, and 24, a lower connection member 395 may be formed in the second peripheral area 22 and the second pad area 62 on the planarization layer 270. The lower connection member 395 may extend in the first direction D1 in the second peripheral area 22, and may overlap a portion of the first lower power line 840 and the first sub-power line 650. The lower connection member 395 may be connected to the first sub-power line 650 and the first lower power line 840 through the fourth contact hole 391 and the fifth contact hole 842, respectively. In some embodiments, a conductive member such as the conductive member 360 of FIG. 5 may be formed in the second peripheral area 22. For example, the conductive member may overlap one side of the lower connection member 395 that is adjacent to a boundary between the second peripheral area 22 and the display area 10, and may be formed on the same layer as the gate electrode 170. The lower connection member 395 may be formed by using a metal, an alloy, metal nitride, conductive metal oxide, a transparent conductive material, and the like. These may be used alone or in combination with each other.

As shown in FIGS. 9 and 10, a second electrode pattern 315 may be formed in the sixth contact hole 652. The second electrode pattern 315 may completely cover the seventh connection pattern 665 exposed by the sixth contact hole 652. The second electrode pattern 315 may be formed by using a metal, an alloy, metal nitride, conductive metal oxide, a transparent conductive material, and the like. These may be used alone or in combination with each other.

In the embodiments, the lower electrode 290, the upper connection member 295, the first electrode pattern 305, the lower connection member 395, and the second electrode pattern 315 may be simultaneously formed by using the same material.

Figure 25:
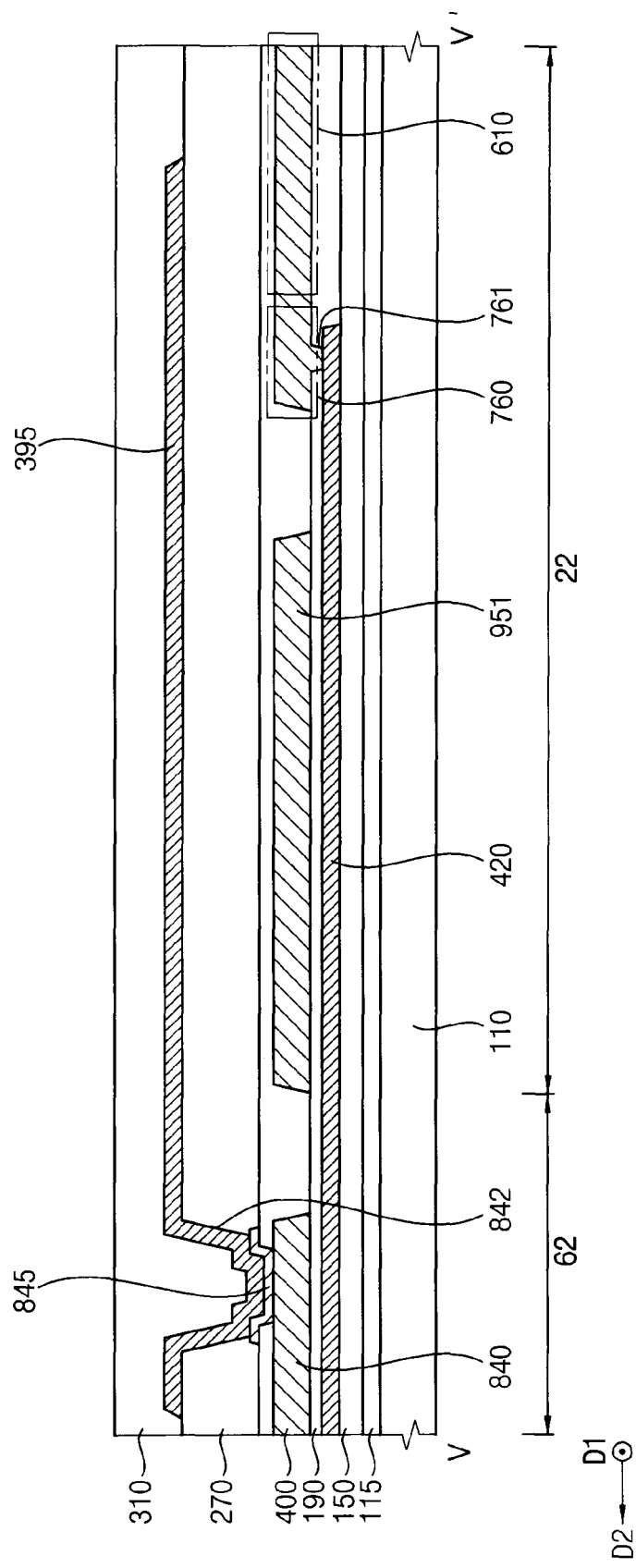

As shown in FIGS. 23, 24, and 25, a pixel defining layer 310 may be formed in the display area 10, the peripheral area 20, the first pad area 61, and the second pad area 62 on the planarization layer 270. The pixel defining layer 310 may cover both side portions of the lower electrode 290, both side portions of the first electrode pattern 305, both side portions of the second electrode pattern 315, the upper connection member 295, and the lower connection member 395. The pixel defining layer 310 may be formed by using an organic material.

Figure 26:
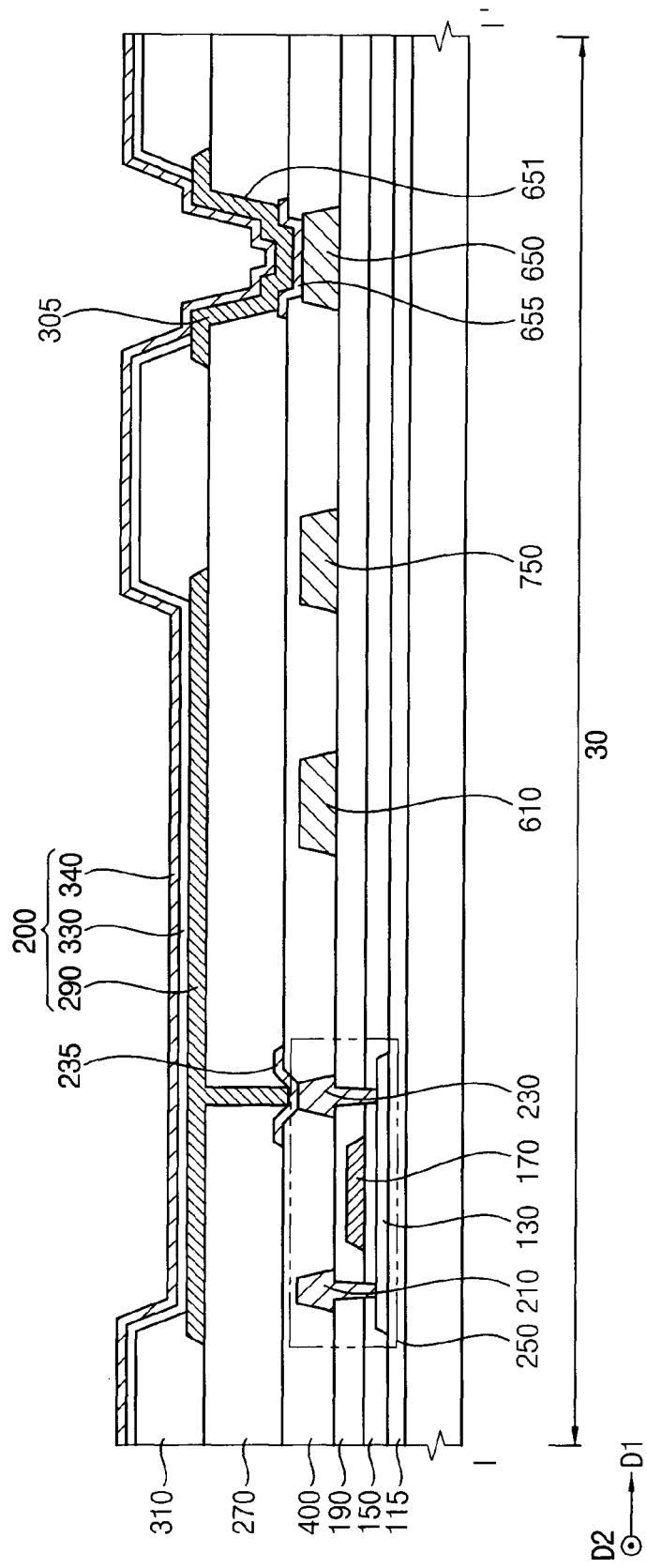

Referring to FIGS. 5, 9, and 26, a light emitting layer 330 may be formed in the display area 10 on the pixel defining layer 310, the lower electrode 290, the first electrode pattern 305, and the second electrode pattern 315. The light emitting layer 330 may have a multilayer structure including an organic light emission layer, a hole injection layer, a hole transport layer, an electron transport layer, an electron injection layer, and the like. The organic light emission layer of the light emitting layer 330 may be formed by using at least one of light emitting materials for emitting different color lights (i.e., a red light, a green light, a blue light, etc.) according to sub-pixels. Alternatively, the organic light emission layer of the light emitting layer 330 may be formed by stacking a plurality of light emitting materials for generating different color lights such as a red light, a green light, and a blue light to emit a white light as a whole.

After the light emitting layer 330 is formed, a portion of a top surface of the first electrode pattern 305 and a portion of a top surface of the second electrode pattern 315 may be exposed through a laser drilling process.

An upper electrode 340 may be formed in the display area 10 on the substrate 110. For example, the upper electrode 340 may be formed in the display area 10 on the light emitting layer 330, and may make direct contact with the first electrode pattern 305 and the second electrode pattern 315 exposed by the light emitting layer 330. In other words, the upper electrode 340 may be formed along a profile of the light emitting layer 330, the first electrode pattern 305, and the second electrode pattern 315. The upper electrode 340 may be formed by using a metal, an alloy, metal nitride, conductive metal oxide, a transparent conductive material, and the like. These may be used alone or in combination with each other.

Accordingly, the sub-pixel structure 200 including the lower electrode 290, the light emitting layer 330, and the upper electrode 340 may be formed.

An encapsulation substrate 450 may be formed in the display area 10 on the upper electrode 340. The encapsulation substrate 450 may face the substrate 110, and may not be formed in the first pad area 61 and the second pad area 62. The encapsulation substrate 450 may include substantially the same material as the substrate 110. For example, the encapsulation substrate 450 may be formed by using a quartz substrate, a synthetic quartz substrate, a calcium fluoride substrate, a fluorine-doped quartz substrate, a soda lime glass substrate, a non-alkali glass substrate, and the like.

Referring to FIG. 2, a first power circuit board 841 and a second power circuit board 941 may be formed on the first pad electrodes 471, and a first power circuit board 841, a second power circuit board 941, and a driving circuit board 900 may be formed on the second pad electrodes 472.

Accordingly, the display device 100 shown in FIGS. 1 to 12 may be manufactured.

The present invention may be applied to various electronic devices including a display device. For example, the present invention may be applied to a number of the electronic devices such as vehicle-display devices, ship-display devices, aircraft-display devices, portable communication devices, display devices for display or for information transfer, medical-display devices, etc.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

The invention claimed is:

1. A display device comprising:
    a substrate including a display area, a peripheral area surrounding the display area and including a first peripheral area and a second peripheral area, a first pad area disposed along a first side of the peripheral area, and a second pad area disposed along a second side of the peripheral area opposite the first side of the peripheral area;
    a gate line disposed on the display area;
    a first upper power line disposed on the first pad area;
    a conductive member disposed on the first peripheral area, which is adjacent to the first pad area;
    a protective insulating layer disposed on the conductive member;
    a planarization layer disposed on the protective insulating layer;
    an upper connection member disposed on the planarization layer such that the upper connection member overlaps both the first pad area and the first peripheral area, the upper connection member electrically connecting the first upper power line and the conductive member to each other through a first contact hole, which is formed in both the protective insulating layer and the planarization layer and is disposed on a portion of the conductive member, and a second contact hole, which is formed in both the protective insulating layer and the planarization layer and is disposed on a portion of the first upper power line; and
    a sub-pixel structure disposed on the protective insulating layer such that the sub-pixel structure overlaps the display area, wherein:
    the sub-pixel structure comprises a thin film transistor, and
    a gate electrode of the thin film transistor is electrically connected to the gate line.

2. The display device of claim 1, further comprising:
    a first connection pattern disposed between the protective insulating layer and the planarization layer to overlap the first contact hole, the first connection pattern covering a top surface of the conductive member so that the conductive member is not exposed; and
    a second connection pattern disposed between the protective insulating layer and the planarization layer to overlap the second contact hole, the second connection pattern covering a top surface of the first upper power line so that the first upper power line is not exposed.

3. A display device comprising:
    a substrate including a display area, a peripheral area surrounding the display area and including a first peripheral area and a second peripheral area, a first pad area disposed along a first side of the peripheral area, and a second pad area disposed along a second side of the peripheral area opposite the first side of the peripheral area;
    a first upper power line disposed on the first pad area;
    a conductive member disposed on the first peripheral area, which is adjacent to the first pad area;
    a protective insulating layer disposed on the conductive member;
    a planarization layer disposed on the protective insulating layer;
    an upper connection member disposed on the planarization layer such that the upper connection member overlaps both the first pad area and the first peripheral area, the upper connection member electrically connecting the first upper power line and the conductive member to each other through a first contact hole, which is formed in both the protective insulating layer and the planarization layer and is disposed on a portion of the conductive member, and a second contact hole, which is formed in both the protective insulating layer and the planarization layer and is disposed on a portion of the first upper power line; and
    a sub-pixel structure disposed on the protective insulating layer such that the sub-pixel structure overlaps the display area, wherein:
    the conductive member includes:
        a first extension part extending in a first direction that is parallel to a top surface of the substrate, the first extension part being disposed on the first peripheral area; and
        a second extension part extending from a first side of the first extension part in a second direction, which is a direction extending from the first peripheral area to the display area, the second extension part being disposed on both a portion of the first peripheral area and the display area, and the first contact hole is disposed on a portion of the first extension part.

4. The display device of claim 3, wherein the first contact hole has a bar shape in a plan view.

5. The display device of claim 4, wherein a length of the first contact hole in the first direction is equal to a length of the first extension part in the first direction.

6. The display device of claim 1, wherein:
the conductive member includes:
   a first extension part extending in a first direction that is parallel to a top surface of the substrate, the first extension part being disposed on the first peripheral area; and
   a second extension part extending from a first side of the first extension part in a second direction, which is a direction extending from the first peripheral area to the display area, the second extension part being disposed on both a portion of the first peripheral area and the display area, and
the sub-pixel structure includes:
   a lower electrode disposed on both the display area and the planarization layer;
   a light emitting layer disposed on the lower electrode; and
   an upper electrode disposed on the light emitting layer.

7. The display device of claim 6, wherein:
the upper electrode is electrically connected to the second extension part through a third contact hole, which is formed in both the protective insulating layer and the planarization layer and is disposed on the second extension part; and
the second extension part is defined as a first sub-power line.

8. The display device of claim 7, further comprising:
a third connection pattern disposed between the protective insulating layer and the planarization layer to overlap the third contact hole, the third connection pattern covering a top surface of the second extension part so that the second extension part is not exposed; and
a first electrode pattern disposed between the upper electrode and the third connection pattern.

9. The display device of claim 7, further comprising:
a first lower power line disposed on the second pad area;
a second lower power line disposed on the second pad area and the second peripheral area that is adjacent to the second pad area; and
fan-out lines disposed between the second pad area and the first and second lower power lines and between the second peripheral area and the first and second power lines.

10. The display device of claim 9, wherein:
the first lower power line is configured to receive a first power;
the second power line is configured to receive a second power having a voltage level that is different from a voltage level of the first power; and
the fan-out lines are configured to receive a data signal.

11. The display device of claim 9, further comprising:
a lower connection member disposed on both the second pad area and the second peripheral area, the planarization layer being disposed on the lower connection member,
wherein the lower connection member electrically connects the first lower power line and the first sub-power line through a fourth contact hole, which is formed in both the protective insulating layer and the planarization layer and is disposed on the first lower power line, and a fifth contact hole, which is disposed on the first sub-power line that is adjacent to the second peripheral area.

12. The display device of claim 11, further comprising:
a fourth connection pattern disposed between the protective insulating layer and the planarization layer to overlap the fourth contact hole, the fourth connection pattern covering the fourth contact hole so that the first lower power line is not exposed; and
a fifth connection pattern disposed between the protective insulating layer and the planarization layer to overlap the fifth contact hole, the fifth connection pattern covering the fifth contact hole so that the first sub-power line is not exposed.

13. The display device of claim 7, wherein, in a view in a direction perpendicular to the substrate, the light emitting layer does not overlap the third contact hole.

14. The display device of claim 1, further comprising:
upper inspection pads disposed in a same layer as the first upper power line and the conductive member,
wherein the upper inspection pads are arranged in a first direction on the first peripheral area, the first direction being parallel to a top surface of the substrate.

15. A display device comprising:
a substrate including a display area, a peripheral area surrounding the display area and including a first peripheral area and a second peripheral area, a first pad area disposed along a first side of the peripheral area, and a second pad area disposed along a second side of the peripheral area opposite the first side of the peripheral area;
a first upper power line disposed on the first pad area;
a second upper power line disposed on both the first pad area and the first peripheral area, the second upper power line being configured to provide a different voltage level than the first upper power line;
a conductive member disposed on the first peripheral area, which is adjacent to the first pad area, the second upper power line being closer to the substrate than both the first upper power line and the conductive member;
a protective insulating layer disposed on the conductive member;
a planarization layer disposed on the protective insulating layer:
an upper connection member disposed on the planarization layer such that the upper connection member overlaps both the first pad area and the first peripheral area, the upper connection member electrically connecting the first upper power line and the conductive member through a first contact hole, which is formed in both the protective insulating layer and the planarization layer and is disposed on the conductive member, and a second contact hole, which is formed in both the protective insulating layer and the planarization layer and is disposed on the first upper power line; and
a sub-pixel structure disposed on the protective insulating layer such that the sub-pixel structure overlaps the display area.

16. The display device of claim 15, wherein:
the second upper power line includes:
   a first line extension part extending in a first direction that is parallel to a top surface of the substrate, the first line extension part being disposed on the first peripheral area;

a second line extension part extending from a first side of the first line extension part in a third direction, which is a direction extending from the first peripheral area to the first pad area, the second line extension part being disposed on the first pad area; and a third line extension part extending from a second side of the first line extension part in a second direction, which is a direction extending from the first peripheral area to the display area, the third line extension part being disposed on in the display area, the second side of the first line extension part opposing the first side of the first line extension part, and the conductive member overlaps the third line extension part.

17. The display device of claim 16, further comprising:
a second sub-power line disposed on both a portion of the first peripheral area and the display area, wherein:
the second sub-power line extends in the second direction, and
the second sub-power line is electrically connected to the third line extension part in a region overlapping the first peripheral area.

18. The display device of claim 17, wherein the second sub-power line is disposed in a same layer as both the first upper power line and the conductive member.

19. The display device of claim 1, further comprising:
first pad electrodes disposed on the first pad area; and
second pad electrodes disposed on the second pad area.

20. The display device of claim 19, further comprising:
a first power circuit boards configured to receive a first power;
a second power circuit boards configured to receive a second power having a voltage level that is different from a voltage level of the first power; and
a driving circuit boards configured to receive a data signal, wherein:
the first power circuit board and the second power circuit board are electrically connected to at least some of the first pad electrodes; and
the first power circuit board, the second power circuit board, and the driving circuit board are electrically connected to at least some of the second pad electrodes.

\* \* \* \* \*